United States Patent
Baba et al.

(10) Patent No.: US 6,437,450 B1
(45) Date of Patent: Aug. 20, 2002

(54) METHOD OF MOUNTING SEMICONDUCTOR CHIP

(75) Inventors: Shunji Baba; Takatoyo Yamakami; Norio Kainuma; Kenji Kobae; Hidehiko Kira; Hiroshi Kobayashi, all of Kawasaki (JP)

(73) Assignee: Fujitsu, Limited, Kawasaki (JP)

( * ) Notice: Subject to any disclaimer, the term of this patent is extended or adjusted under 35 U.S.C. 154(b) by 0 days.

(21) Appl. No.: 09/614,726

(22) Filed: Jul. 12, 2000

(51) Int. Cl.[7] .............................................. H01R 23/48
(52) U.S. Cl. ....................................... 257/778; 257/782
(58) Field of Search .......................... 228/180.22, 106; 257/782, 787, 778, 719, 785

(56) References Cited

U.S. PATENT DOCUMENTS

| | | | | |
|---|---|---|---|---|
| 5,305,944 A | * | 4/1994 | Yoshida et al. | 228/180.22 |
| 5,866,950 A | * | 2/1999 | Iwasaki et al. | 257/782 |
| 6,100,597 A | * | 8/2000 | Nakamura | 257/787 |
| 6,172,422 B1 | * | 1/2001 | Chigawa et al. | 257/778 |
| 6,193,136 B1 | * | 2/2001 | Higashi et al. | 228/106 |

* cited by examiner

Primary Examiner—David Nelms
Assistant Examiner—B. Le
(74) Attorney, Agent, or Firm—Armstrong, Westerman & Hattori, LLP

(57) ABSTRACT

A method of mounting a semiconductor chip in which an IC chip is mounted by filling a gap between the chip and a substrate with adhesive which functions as an underfill. The fillet of the underfill is made to have a preferable shape. To accomplish this, a head IC chip provided with bumps is placed on a suspension that is covered with the underfill adhesive and is provided with pads. A bonding tool presses the head IC chip and applies ultrasonic oscillation to the head IC chip, so that the bumps are properly bonded to the pads. When the head IC chip is pressed and subjected to ultrasonic oscillation, the ultraviolet rays 108 are emitted so as to harden the peripheral portion 151a of the adhesive 151 spread out between the head IC chip 11 and the suspension 12.

4 Claims, 33 Drawing Sheets

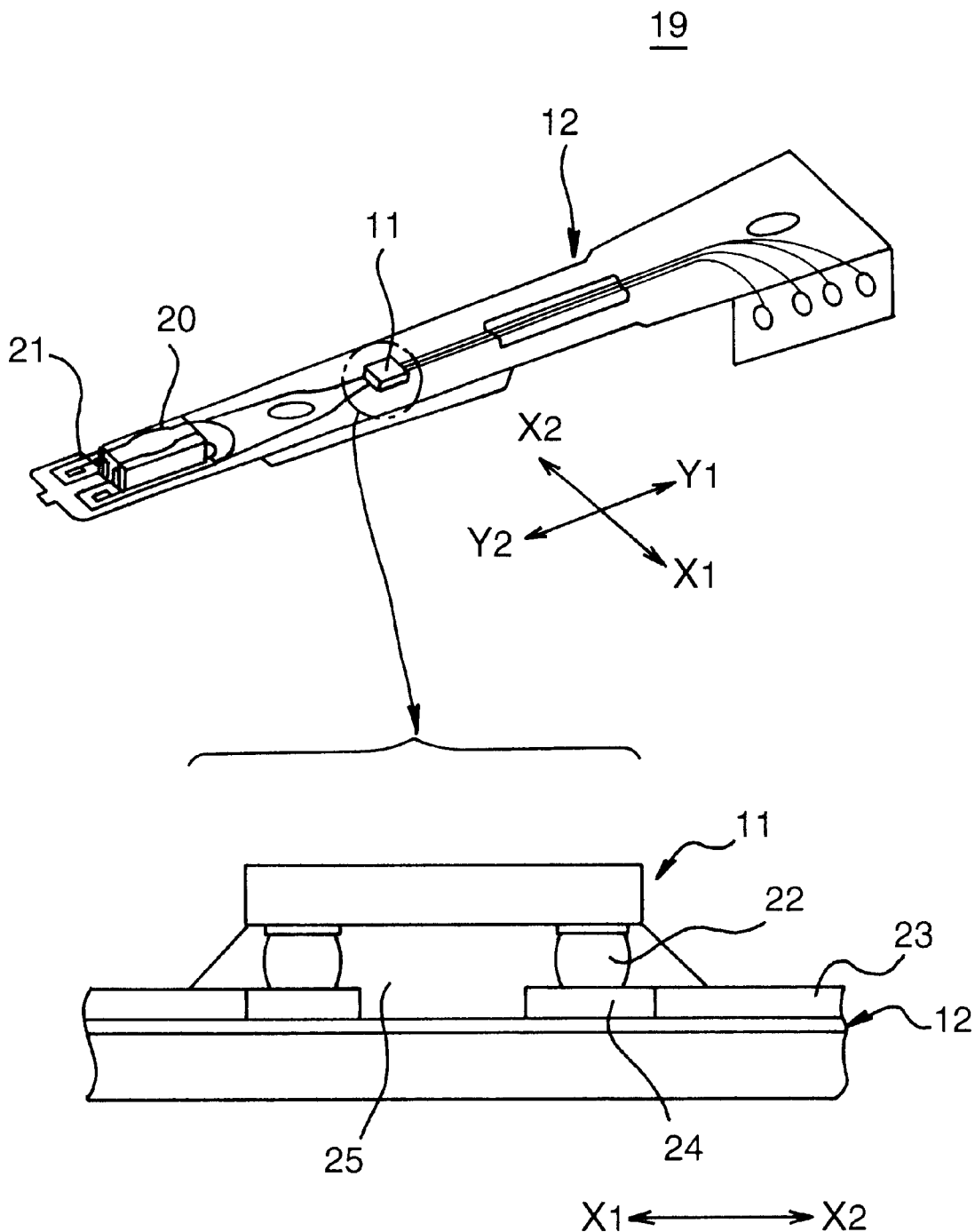

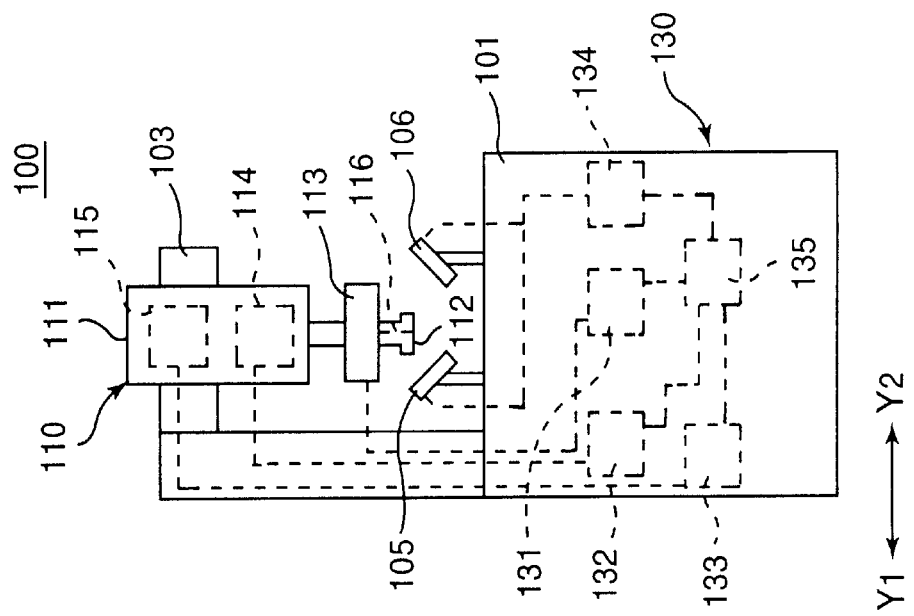
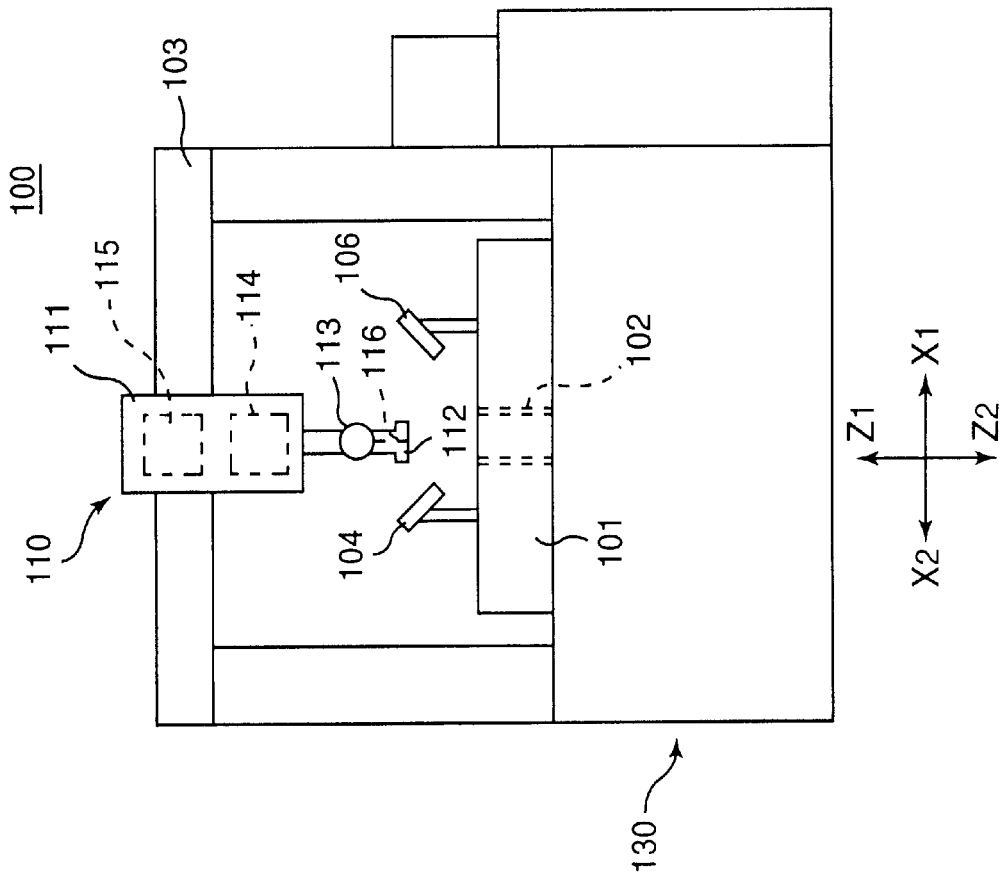

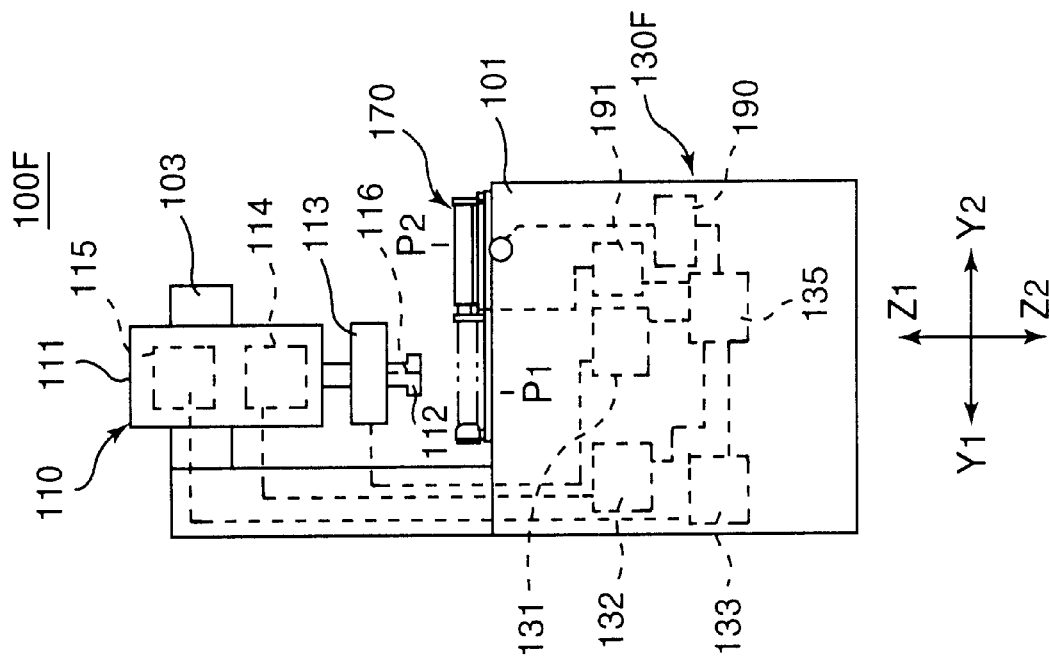
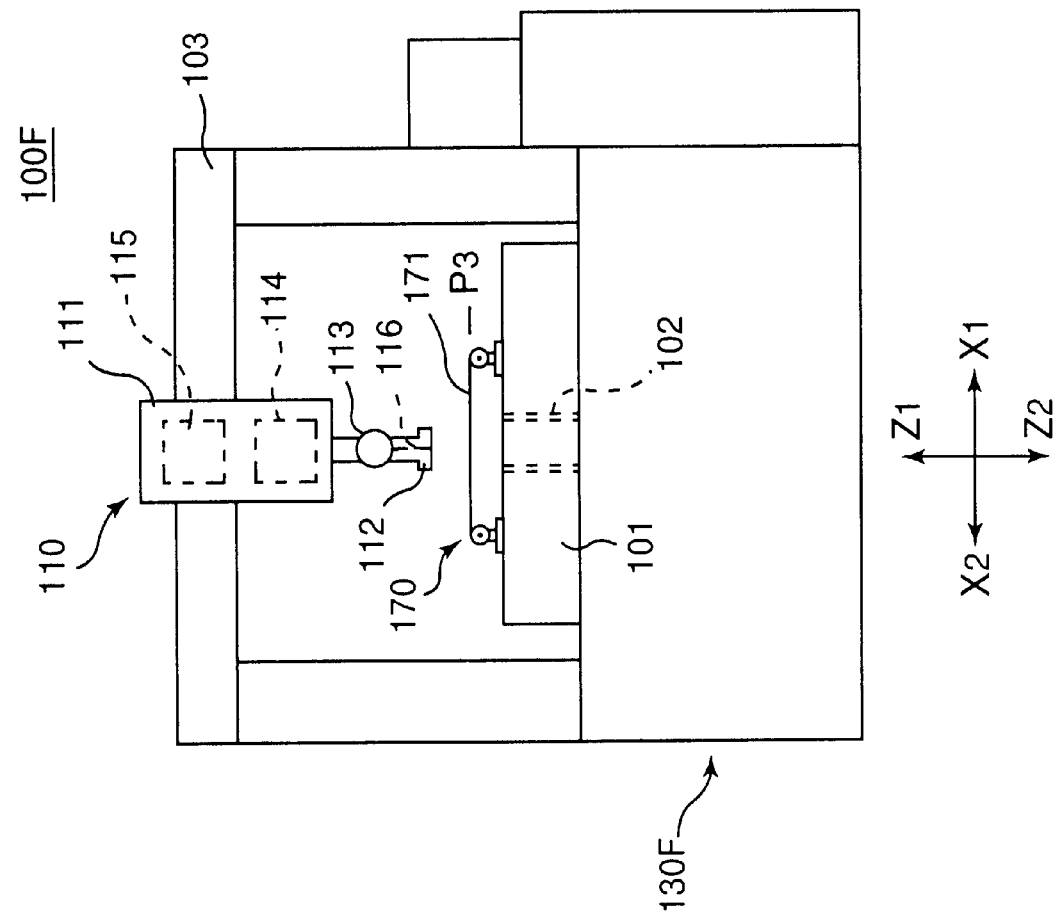

$\mu10, \mu11 > \mu1$

METHOD OF MOUNTING SEMICONDUCTOR CHIP

BACKGROUND OF THE INVENTION

1. Field of the Invention

The present invention generally relates to a method of mounting a semiconductor chip and an apparatus for mounting a semiconductor chip.

The method of mounting a semiconductor chip can be applied to mounting of a head IC chip 11 of a hard disk device 10 to a suspension 12, as shown in FIGS. 1A and 1B, or to mounting of an IC chip 31 of a printed circuit board unit 30 to a substrate 32, as shown in FIGS. 3A to 3C.

As shown in FIGS. 1A and 1B, the hard disk device 10 has a hard disk 16 that rotates at high speed in a hermetically sealed housing 15, and a head slider assembly 19 attached to the top end of an arm 18. The head slider assembly 19 comprises a head slider 20 and the head IC chip 11 mounted on the suspension 12, as shown in FIG. 2. The head slider 20 has a magnetic head 21 formed by a thin film forming technique. The head IC chip 11 fimctions to control the magnetic head 21 by amplifying a weak signal read by the magnetic head 21, for instance. As shown in the enlarged view in FIG. 2, the head IC chip 11 has Au bumps 22 on its lower surface joined to Au pads 24 at the edge of a wiring pattern 23.

The printed circuit board unit 30 comprises a multi chip module 36 provided with a heat sink, a memory socket 38, and an I/O connector 39, all mounted on a mother board 35, as shown in FIG. 3A. The multi chip module 36 has a plurality of IC chips 31 mounted on the substrate 32, as shown in FIG. 3B. The head IC chip 31 has Au bumps 42 on its lower surface bonded to Au pads 43 formed on the substrate 32. The head IC chip 31 is also bonded onto the substrate 32 by underfill 44.

2. Description of the Related Art

FIGS. 4A to 4C illustrate a method of producing a conventional head slider assembly. The head IC chip 11 has Au bumps 51 on its lower surface. The suspension 12 has Au pads 61 on its upper surface. This head slider assembly is manufactured in the following manner.

First, the suspension 12 is fixed onto a stage 70. A predetermined amount of insulating adhesive 71 functioning as "underfill" is then applied to the upper surface of the suspension 12, using a precision dispenser (not shown). The head IC chip 11 is picked up by vacuum suction of a tool 75 having a suction hole 76, and is moved onto the suspension 12. The tool 75 then presses the head IC chip 11 by a force F, and ultrasonic vibration of several $\mu$m amplitude is applied to the head IC chip 11 for several seconds, as indicated by an arrow B. By doing so, the Au bumps 51 are bonded to the Au pads 61. The vacuum suction of the tool 75 is then stopped, so that the tool 75 is separated from the head IC chip 11. The suspension 12 is then moved to a heating furnace 80, so that the adhesive 71 is hardened by heat. Here, underfill 72 is formed, and the head IC chip 11 is bonded to the suspension 12 by the underfill 72. Thus, the head slider assembly 19 is completed.

The above method of producing a conventional head slider assembly exhibits at least the following disadvantages:

1. The shape of the fillet of the underfill is unstable.

The adhesive 71 functioning as the underfill is circular on the suspension 60, as indicated by a two-dot chain line in FIG. 5A. As the tool 75 presses the head IC chip 11, the adhesive 71 is pressed by the lower surface of the head IC chip 11, and is radially spread out. The spread adhesive 71 reaches the periphery of the lower surface of the head IC chip 11, and forms a fillet 90. The shape of the fillet 90 is determined by the spread state of the adhesive 71 to functions as the underfill. The spread state of the adhesive 71 varies with the applied amount and the applied position of the adhesive 71. Depending on the situation, the adhesive 71 may significantly overflow on the upper surface of the suspension 12, as indicated by reference numeral 91 in FIGS. 5A and 5B.

As the hard disk device becomes smaller, the width W1 of the suspension 12 becomes smaller. On the other hand, as more functions are added, the head IC chip 11 becomes larger in the direction of L1 shown in FIG. 5A. Accordingly, the extra portion 92 outside the mounted head IC chip 11 on the suspension 12 becomes smaller in a width W2. Furthermore, the large amount of overflow of the adhesive has an adverse effect on the on the floating characteristic of the head slider 20 with respect to a hard disk.

As for the multi-chip module 36 shown in FIGS. 3A to 3B, the large amount of overflow of the adhesive on the upper surface of the substrate 32 often hinders the mounting of other components.

2. The overflowing adhesive sticks to the tool 75.

Depending on the applied amount and the applied position of the adhesive 71, the adhesive 71 overflows onto the upper surface of the head IC chip 11 and sticks to the top end of the tool 75, as indicated by reference numeral 93 in FIGS. 6A and 6B.

When the adhesive 71 sticks to the top end of the tool 75, the suction operation of the tool 75 becomes unstable. Therefore, the top end of the tool 75 requires cleaning often. However, it is troublesome to clean the top end of the tool 75 every time the mounting of one head IC chip 11 is completed.

The applied adhesive 71 is applied in a circular pattern and spreads radially, when seen from above. Accordingly, the adhesive 71 overflows from the sides of the head IC chip 11, and reaches the upper surface of the head IC chip 11.

3. The transmission rate of ultrasonic waves from the tool 75 to the head IC chip 11 is low.

As shown in FIG. 4B, the tool 75 is brought into contact directly with the head IC chip 11. The tool 75 is made of stainless steel, and the head IC chip 11 is made of silicon. The friction coefficient $\mu$1 between the tool 75 and the IC chip 11 is in the range of 0.5 to 0.7, which is relatively low. Accordingly, the transmission rate of ultrasonic waves from the tool 75 to the head IC chip 11 is low, and the bonding of the Au bumps 51 to the Au pads 61 requires a long period of time.

4. The head IC chip often deviates at the time of mounting, and the deviation results in defective mounting.

As shown in FIG. 4B, the tool 75 and the head IC chip 11 are in contact with each other.

Due to the slight orientation of the end surface 75a of the tool 75, the head IC chip 11 slightly deviates from the initial position shown in FIG. 7A in one direction of the ultrasonic oscillation (in the X1 direction, for instance) every time the tool 75 ultrasonically oscillates. Depending on the situation, the Au bumps 51 might slip off the Au pads 61, as shown in FIG. 7B, resulting in defective bonding.

In the multi-chip module 36 shown in FIGS. 3A to 3C, the pads formed on the substrate 32 each have a rectangular shape, as indicated by reference numeral 43A in FIG. 8.

However, the longitudinal direction of the horizontally aligned pads 43A in FIG. 8 is equivalent to the width direction of the vertically aligned pads 43A in FIG. 8. Accordingly, the pads on the substrate 32 are not always effective in preventing the head IC chip 11 from deviating when the tool 75 ultrasonically oscillates.

In view of this, the present invention is directed to providing a semiconductor chip mounting method and device, in which the above problems are eliminated.

SUMMARY OF THE INVENTION

To solve the problems mentioned above, the present invention provides a method of mounting a semiconductor chip, comprising the steps of:

bonding bumps formed on the semiconductor chip to pads formed on a substrate by pressing the semiconductor chip, with insulating adhesive being interposed between the semiconductor chip and the substrate; and hardening the insulating adhesive spread out between the semiconductor chip and the substrate, wherein the bonding step includes the step of hardening a peripheral portion of the insulating adhesive spread out between the semiconductor chip and the substrate.

Since the peripheral portion of the insulating adhesive spread out between the semiconductor chip and the substrate while the semiconductor chip is pressed, a large amount of overflow of the insulating adhesive can be prevented. Thus, the fillet of the underfill can be formed in a preferable shape.

In the above method, the bonding step may further include the step of applying ultrasonic oscillation to the semiconductor chip so that the bumps formed on the semiconductor chip are bonded to the pads formed on the substrate.

Since the insulating adhesive does not overflow in large volume, the insulating adhesive can be prevented from entering the contact space between the bonding tool and the semiconductor chip. Thus, the preferable contact condition can be maintained.

In the above method, the peripheral portion of the insulating adhesive may be hardened by either light or heat.

With light or heat, the peripheral portion of the insulating adhesive spread out between the semiconductor chip and the substrate can be quickly and stably hardened.

The present invention also provides a semiconductor chip mounting device that comprises a mechanism for pressing a semiconductor chip while an insulating adhesive is interposed between the semiconductor chip provided with bumps and a substrate provided with pads, and mounts the semiconductor chip on the substrate by bonding the bumps to the pads, the device further comprising a peripheral portion hardening unit that hardens a peripheral portion of the insulating adhesive exposed from a periphery of the semiconductor chip while the semiconductor chip is pressed.

Since the peripheral portion of the insulating adhesive spread out between the semiconductor chip and the substrate while the semiconductor chip is pressed, the insulating adhesive can be prevented from overflowing in large volume. Thus, the fillet of the underfill can be formed in a preferable shape.

The above semiconductor chip mounting device also comprises an ultrasonic oscillator that ultrasonically bonds the bumps to the pads.

Since the insulating adhesive does not overflow in large volume, the insulating adhesive can be prevented from entering the contact space between the bonding tool, which transmits ultrasonic oscillation, and the semiconductor chip. Thus, a preferable contact condition can be maintained.

In the above semiconductor chip mounting device, the peripheral portion hardening unit is either a light supplying unit or a heat supplying unit.

With the light supplying unit or the heat supplying unit, the peripheral portion of the insulating adhesive which spreads out between the semiconductor chip and the substrate can be quickly and stably hardened.

The present invention also provides a semiconductor chip mounting device that comprises a bonding tool that presses a semiconductor chip while an insulating adhesive is interposed between the semiconductor chip provided with bumps and a substrate provided with pads, and ultrasonically bonds the bumps to the pads, in which the bonding tool has basically a square pole shape and has side surfaces that are bent inward with respect to virtual flat surfaces between adjacent corners of the bonding tool.

When the bonding tool presses and ultrasonic oscillation is applied to the semiconductor chip, the insulating adhesive overflows from the sides of the semiconductor chip, and not from the corners of the semiconductor chip. The bonding tool has basically a square pole shape, and the side surfaces of the bonding tool are bent inward with respect to the virtual flat surfaces between the adjacent corners of the bonding tool. In this configuration, the overflowing insulating adhesive cannot reach and stick to the bonding tool. Accordingly, there is no need to clean the bonding tool. Also, since the bonding tool is basically the square pole, the entire semiconductor chip including the corners can be evenly pressed by the bonding tool. Thus, no cracks occur in the semiconductor chip.

The present invention also provides a method of mounting a semiconductor chip to be mounted on a substrate by a bonding tool that presses the semiconductor chip while an insulating adhesive is interposed between the semiconductor chip provided with bumps and the substrate provided with pads, and ultrasonically bonds the bumps to the pads, in which a sheet having a larger friction coefficient with both the semiconductor chip and the bonding tool than a friction coefficient between the semiconductor chip and the bonding tool is interposed between the semiconductor chip and the bonding tool, thereby carrying out ultrasonic bonding.

Since the sheet interposed between the bonding tool and the semiconductor chip has a larger friction coefficient with both the semiconductor chip and the bonding tool than the friction coefficient between the semiconductor chip and the bonding tool, the energy transmission from the bonding tool to the semiconductor chip can be carried out at high efficiency, and the bonding of the bumps formed on the semiconductor chip to the pads formed on the substrate can be completed in a short period of time. Also, less deviation occurs in the location of the semiconductor chip.

The present invention also provides a semiconductor chip mounting device comprising a bonding tool that presses a semiconductor chip while an insulating adhesive is interposed between a semiconductor chip provided with bumps and a substrate provided with pads, and ultrasonically bonds the bumps to the pads; and a means for moving and placing a sheet between the bonding tool and the semiconductor chip which exhibits a greater friction coefficient with both the semiconductor chip and the bonding tool than a friction coefficient between the semiconductor chip and the bonding tool.

Since the friction coefficients between the bonding tool and the sheet and between the sheet and the semiconductor chip are both greater than the friction coefficients between the bonding tool and the semiconductor chip, the energy transmission from the bonding tool to the semiconductor chip can be efficiently carried out by placing the sheet between the bonding tool and the semiconductor chip. Accordingly, the bonding of the bumps formed on the semiconductor chip to the pads formed on the substrate can be completed in a shorter period of time. Also, less deviation occurs in the location semiconductor chip.

The present invention further provides a substrate on which a semiconductor chip is to be mounted by ultrasonic bonding, comprising pads each having a shape that is elongated in a direction of ultrasonic oscillation applied to the semiconductor chip.

When the bonding tool applies ultrasonic oscillation to the semiconductor chip, the semiconductor chip tends to be displaced due to the orientation of the bonding tool. In the above configuration, however, the bumps formed on the semiconductor chip do not move off the pads each having a shape elongated in the direction of the ultrasonic oscillation. Thus, defective bonding can be prevented between the semiconductor chip and the substrate.

BRIEF DESCRIPTION OF THE DRAWINGS

FIG. 2 illustrates a head slider assembly in the hard disk device of FIGS. 1A and 1B;

FIG. 9A and 9B illustrate a head IC chip mounting device of a first embodiment of the present invention;

FIGS. 23A and 23B illustrates a chip mounting device of a fourth embodiment of the present invention;

FIGS. 36A to 36G illustrate the production procedures continued from FIG. 35H.

DETAILED DESCRIPTION OF THE PREFERRED EMBODIMENTS

Figure 1A:
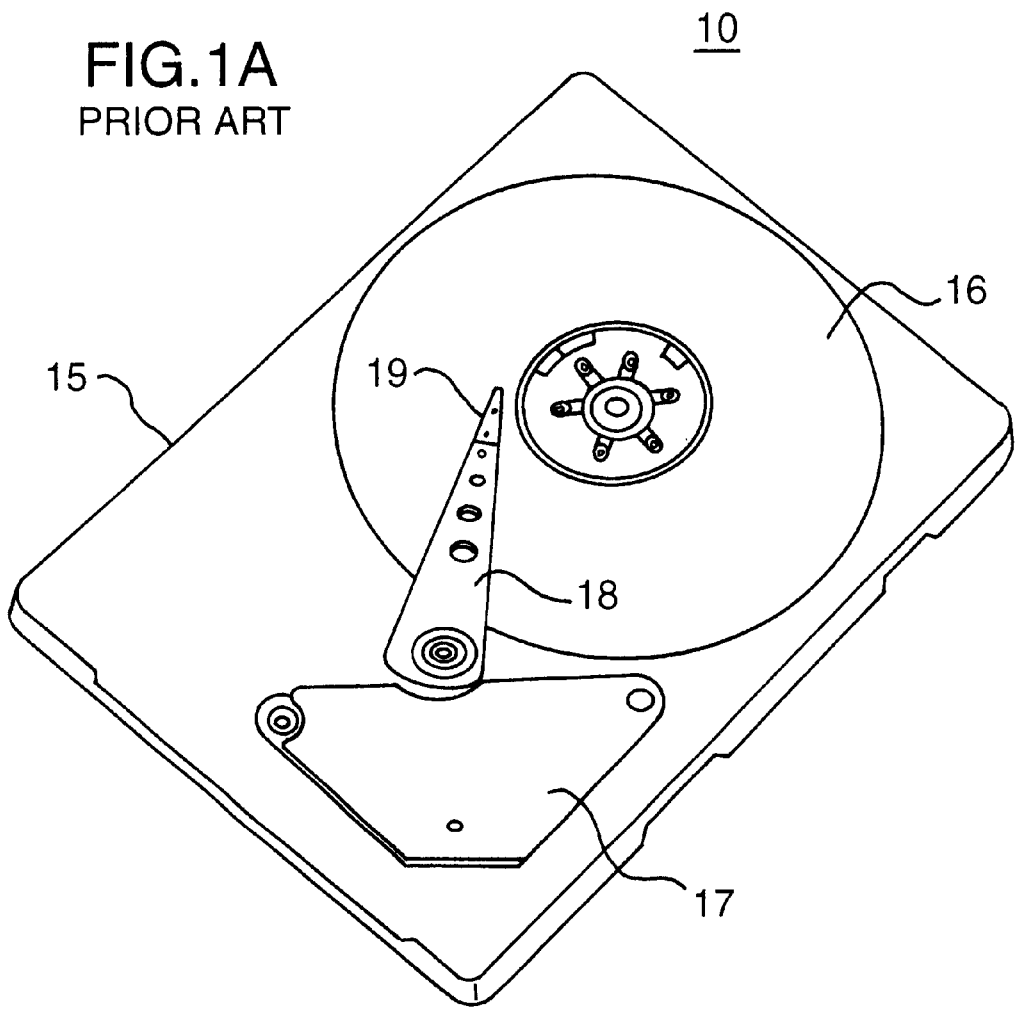
FIGS. 1A and 1B illustrate a conventional hard disk device.
Figure 1B:
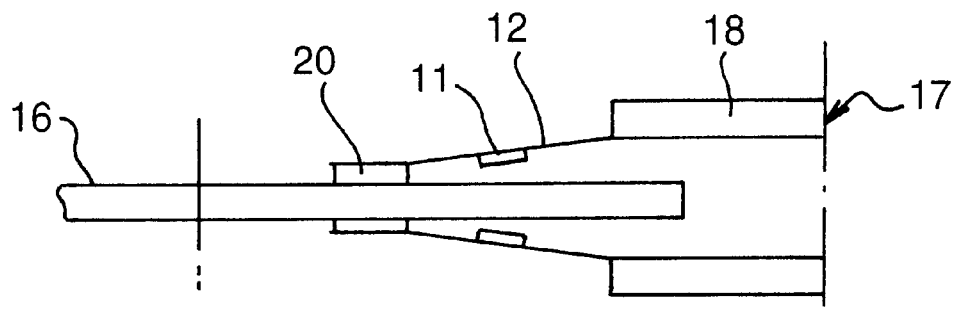

The first embodiment solves the problem that the shape of the fillet of the underfill is insecure.

FIGS. 9A and 9B show a head IC chip mounting device 100 as a first embodiment of the present invention. The head IC chip mounting device 100 comprises a stage 101, a bonding unit 110, and a control unit 130.

The stage 101 accommodates the suspension 12 shown in FIG. 2, and is provided with suction holes 102 for sucking and attracting the suspension 12. Also on the stage 101, four ultraviolet lamps 104 to 107 surround a chip mounting position 109, and face the four sides of a mounted head IC chip 11 so as to irradiate all the four sides of the head IC chip 11 with ultraviolet rays.

The bonding unit 110 comprises a bonding head 111, a bonding tool 112 hanging from the bonding head 111, and an ultrasonic oscillator 113 integrally formed with the bonding tool 112. The bonding tool 112 is moved up and down by an elevating mechanism (not shown). The bonding unit 110 is movably supported by a frame 103 of the head IC chip mounting device 100, and is moved by a moving mechanism (not shown).

The bonding head 111 contains a load cell (a pressing mechanism) 114 and a valve 115 that are connected to a power source or a vacuum source (not shown). The load cell 114 moves the bonding tool 112 up and down, and measures a force to be applied to a head IC chip 50 via the bonding tool 112.

The bonding tool 112 is provided with a suction hole 116 that communicates with the valve 115. The ultrasonic oscillator 113 provides ultrasonic oscillation to the bonding tool 112.

The control unit 130 comprises a controller 131 that controls the ultrasonic oscillator 113, a controller 132 that controls the load cell 114, and a controller 133 that control the valve 115, and a controller 134 that controls the ultraviolet lamps 104 to 107. The control unit 130 further comprises an integrated controller 135 that controls all the controllers 131 to 134.

Figure 11:
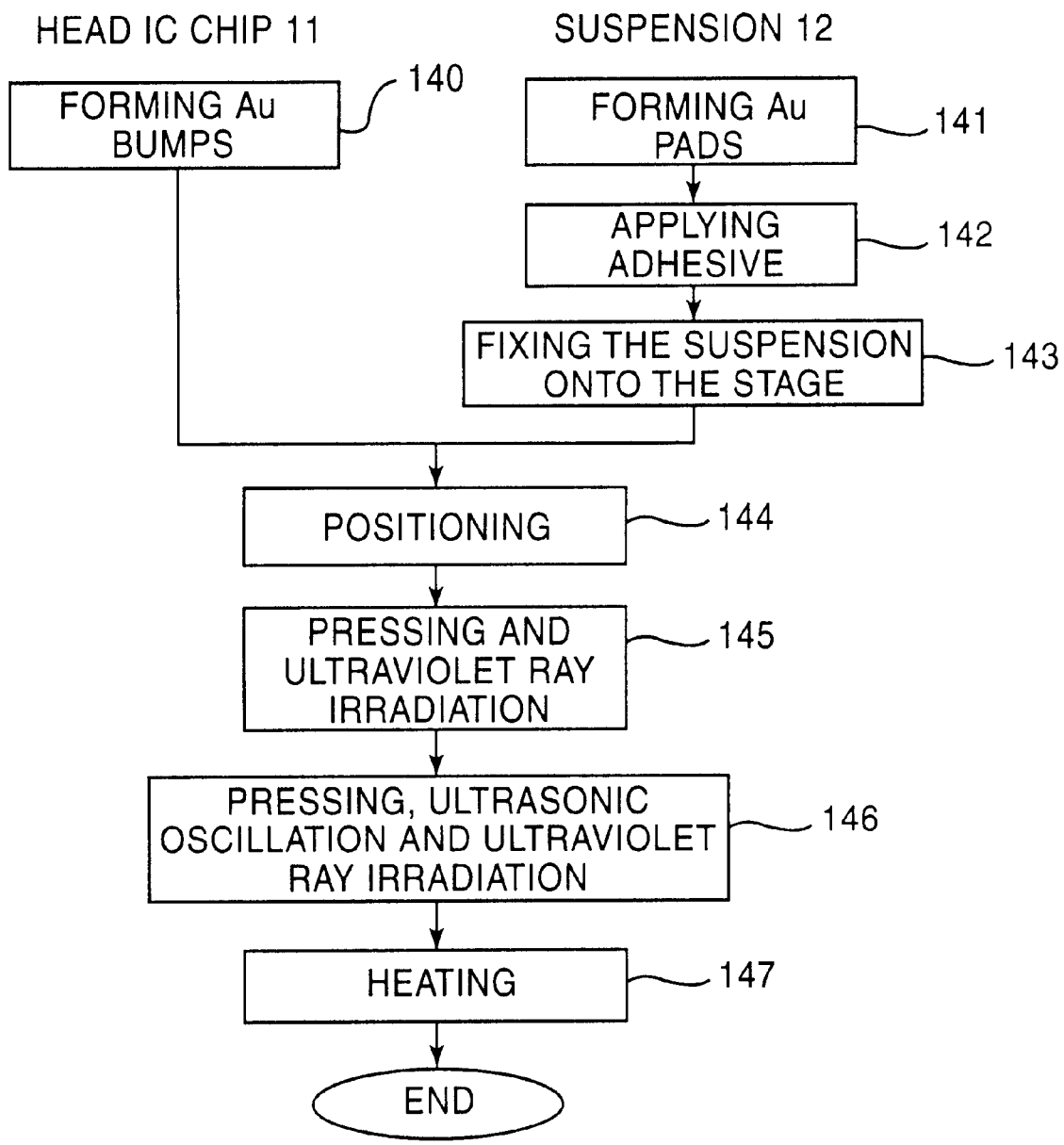
FIG. 11 is a flowchart of the procedures of manufacturing a head slider assembly.

Referring now to FIG. 11, a method of manufacturing the head slider assembly 19 of FIG. 2 using the above head IC chip mounting device 100 will be described below.

The head slider assembly 19 is produced by carrying out steps 140 to 147 shown in FIG. 11. Among steps 140 to 147, steps 144 to 146 are carried out by the head IC chip mounting device 100 operating as shown in FIGS. 12A to 12D.

Step 140

The Au bumps 51 are formed on the lower surface of the head IC chip 11 using a wire bonding device.

Steps 141, 142, and 143

The Au pads 61 are formed on the suspension 12, and adhesive 150 to be the underfill is applied to the center of the chip mounting position 109. With the AU pads 61 and the adhesive 150 facing upward, the suspension 12 is placed on the stage 101, and is sucked to adhere onto the stage 101.

The adhesive 150 consists of a mixture of thermosetting adhesive and an ultraviolet curing agent. More specifically, the adhesive 150 consists of urethane acrylate resin as a main component, benzoin alkyl ether as a photoinitiator for polymerization, and acrylate as a thermosetting initiator.

Figure 12:
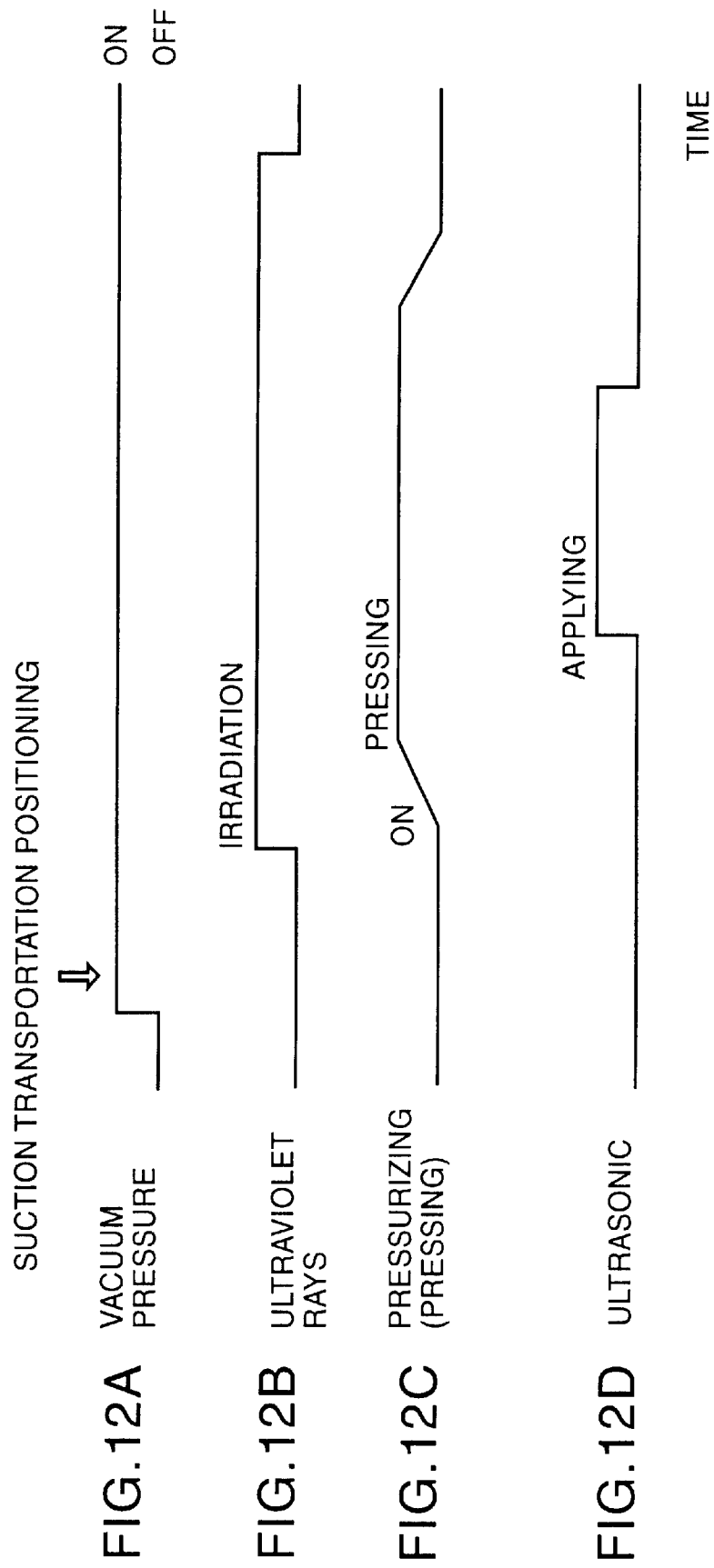
FIGS. 12A to 12D are timing charts of the operation of the chip mounting device of FIGS. 9A and 9B.
Figure 13:
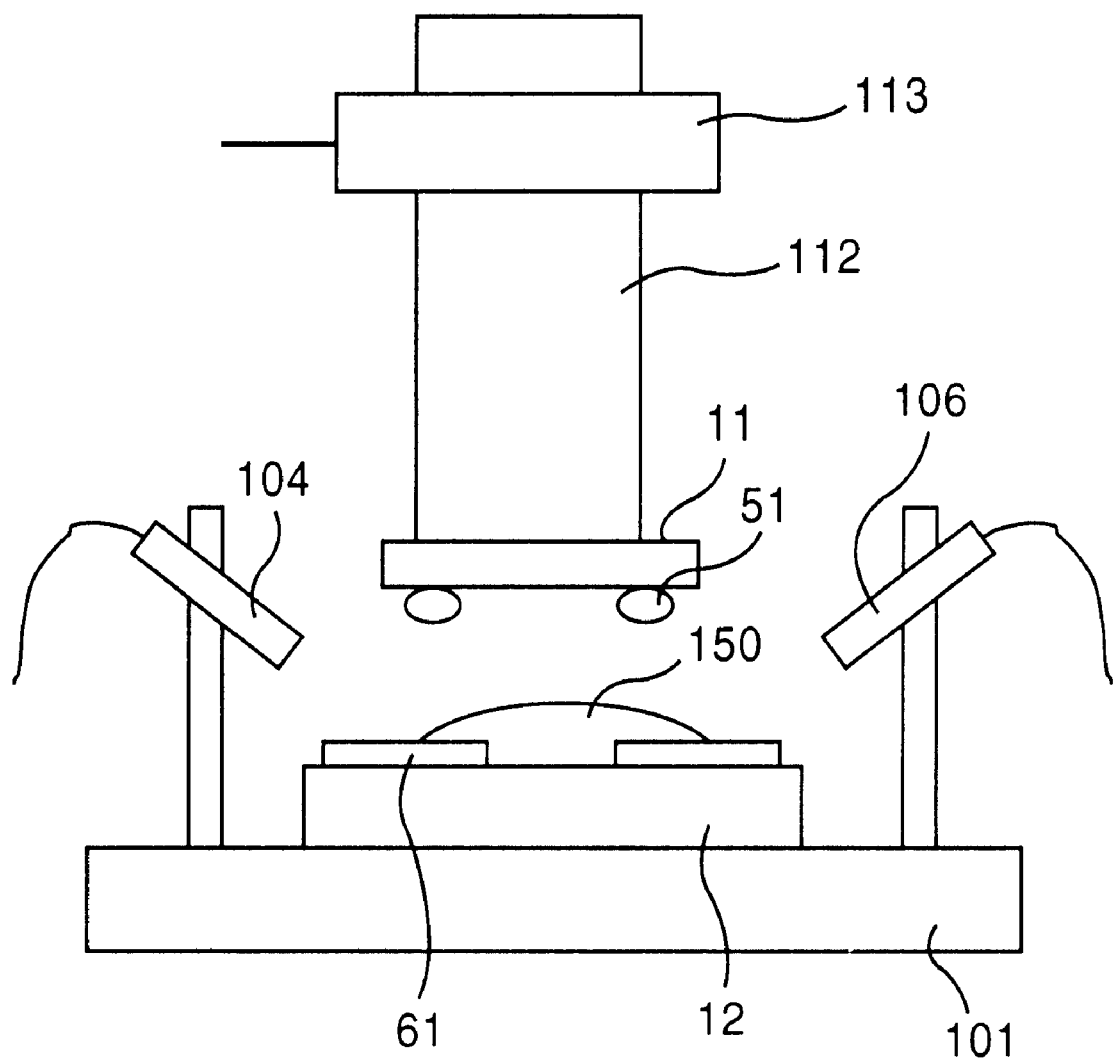
FIG. 13 illustrates a positioning step in the flowchart of FIG. 11.

Positioning Step 144 (see FIGS. 13 and 12A)

The bonding unit 110 is located at the aligning position of head IC chips 11. The bonding tool 112 is moved down by an elevating mechanism (not shown). As shown in FIG. 12A, the valve 115 is opened in accordance with a control signal transmitted from the controller 133. One of the head IC chips 11 is vacuum-sucked by the top end of the bonding tool 112. The bonding tool 112 then moves up to lift up the head IC chip 11. Successively, the bonding unit 110 is moved along the frame 103 by a moving mechanism (not shown) so as to transport the head IC chip 11. The bonding unit 110 is then stopped at such a position that the head IC chip 11 is positioned to the suspension 12, as shown in FIG. 13.

Figure 14:
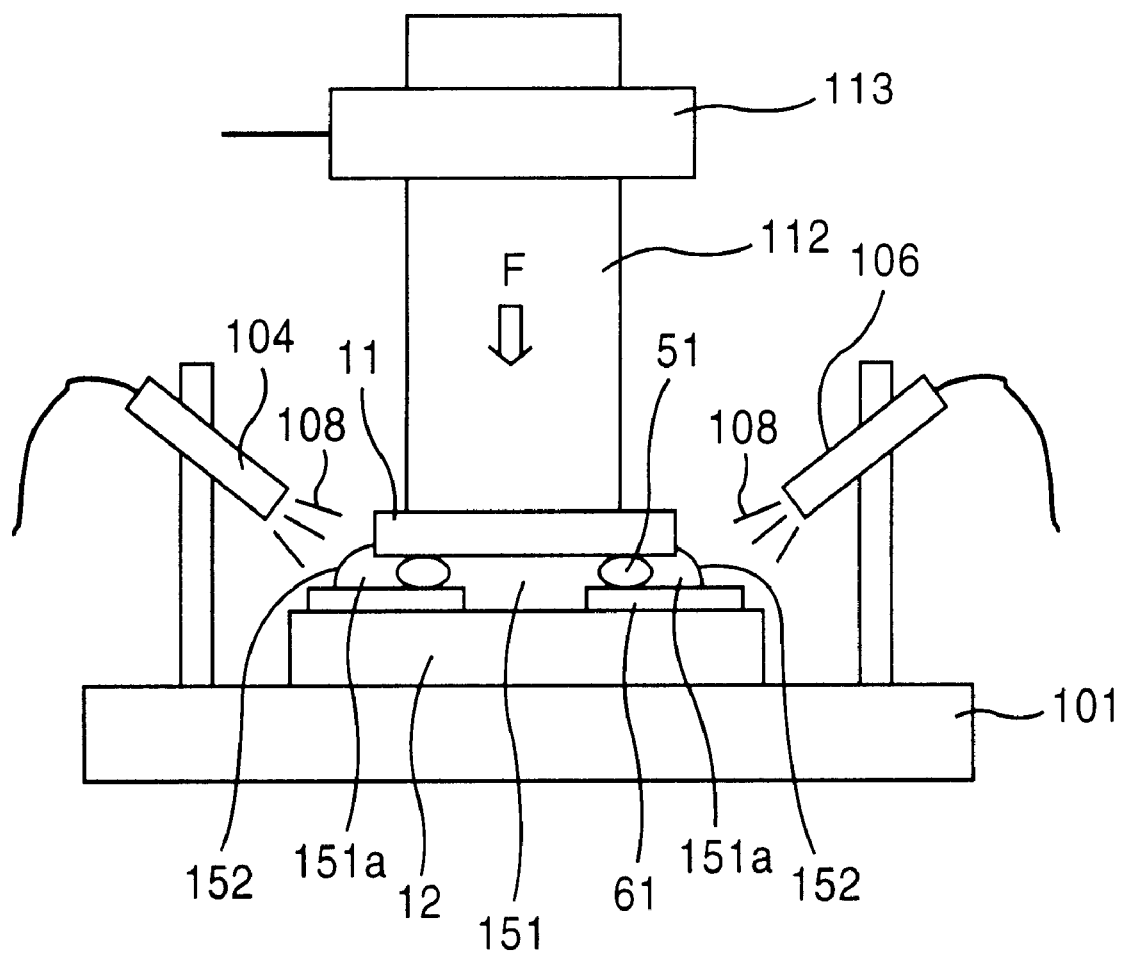
FIG. 14 illustrates a pressing and ultraviolet ray irradiation step in the flowchart of FIG. 11.

Pressing and Ultraviolet Ray Irradiation Step 145 (FIGS. 14, 12B, and 12C)

As the elevating mechanism (not shown) is actuated, the load cell 114 operates in accordance with a control signal transmitted from the controller 132, as shown in FIG. 12C. The bonding tool 112 is then moved down to pressurize the head IC chip 11 with a predetermined force F, thereby pressing the AU bumps 51 toward the Au pads 61. The head IC chip 11 also spreads out the adhesive 150 by the force F. Here, the adhesive 150 is spread out to such an extent that the edge of the adhesive 150 overflows out of the rim of the head IC chip 11. In FIG. 14, reference numeral 151 indicates the adhesive spread out on the suspension 12 by the head IC chip 11.

When the load cell 114 starts pressurizing the head IC chip 11, the ultraviolet lamps 104 to 107 are switched on in accordance with a control signal transmitted from the controller 134. The area surrounding the head IC chip 11 is irradiated with ultraviolet rays 108, and the portion 151a of the adhesive 151 exposed out of the rim of the head IC chip 11 starts hardening. Accordingly, the spread-out adhesive 151 is partially hardened. In FIG. 14, reference numeral 152 indicates the hardened portion.

In the above manner, the portion 151a of the adhesive 151 exposed out of the rim of the head IC chip 11 is hardened so that a rigid film is formed at the exposed portion 151a. Accordingly, when the head IC chip 11 is pressed against the suspension 12, the adhesive 151 is prevented from flowing out of the suspension 12.

The ultraviolet rays 108 do not reach the bottom of the head IC chip 11. Accordingly, the portion of the adhesive 151 under the head IC chip 11 has not hardened at this point. Thus, the adhesive 150 can be smoothly spread out when the head IC chip 11 is pressed, and the Au bumps 51 can be accurately pressed against the Au pads 61.

Pressing, Ultrasonic Oscillation, and Ultraviolet Ray Irradiation Step 146 (see FIGS. 15, 16, 12A, 12B, 12C, and 12D)

As shown in FIGS. 12A, 12B, and 12C, the ultraviolet lamps 104 to 107 are on, the bonding tool 112 vacuum-sucks the head IC chip 11, and the load cell 114 presses the head IC chip 11. Under this condition, the ultrasonic oscillator 113 starts oscillating in accordance with a control signal transmitted from the controller 131, and keeps oscillating for several seconds.

Figure 15:
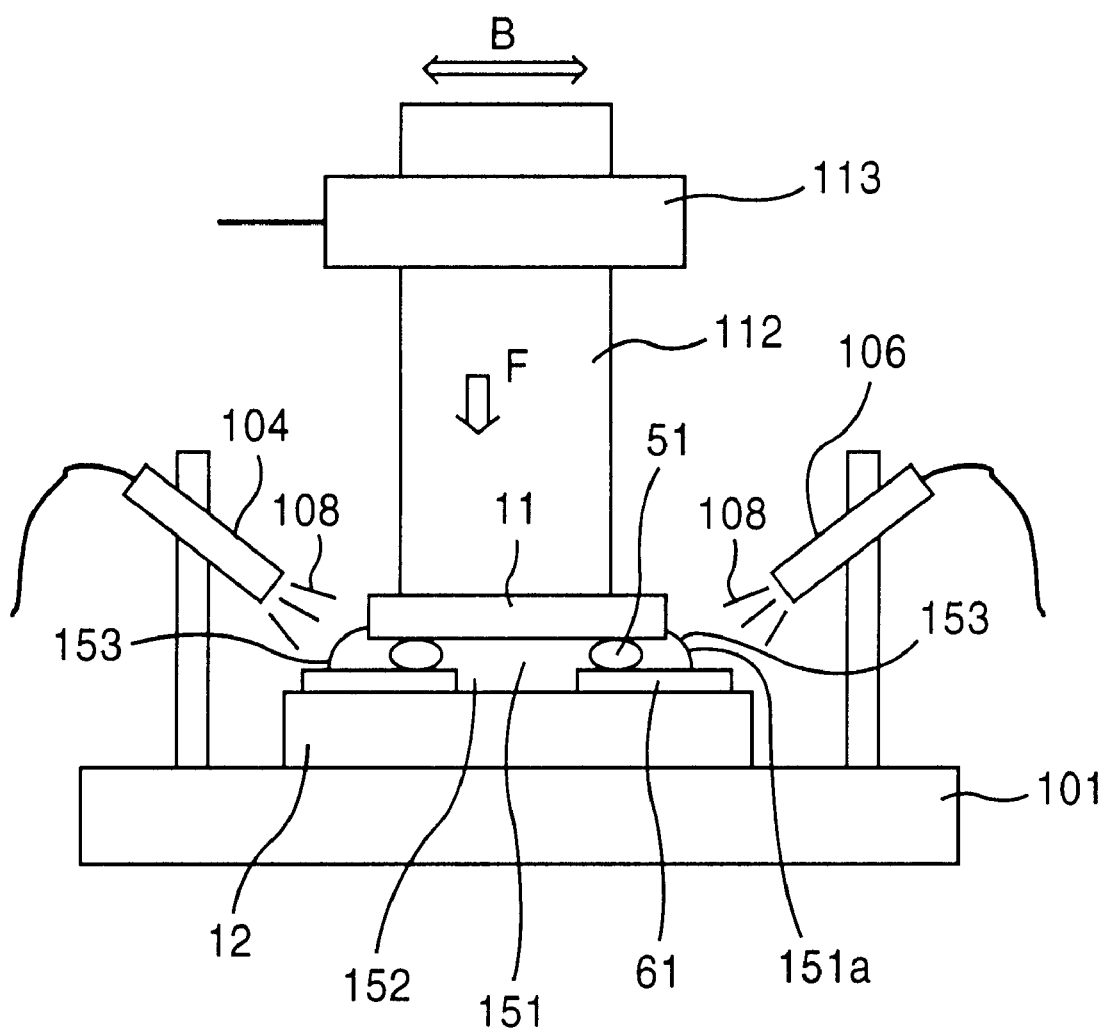
FIG. 15 illustrates a pressing, ultrasonic oscillation, and ultraviolet ray irradiation step in the flowchart of FIG. 11.

FIG. 15 illustrates the above situation. When the ultrasonic oscillator 113 oscillates, the bonding tool 112 ultrasonically oscillates as indicated by the arrow B. The ultrasonic oscillation of the bonding tool 112 is transmitted to the Au bumps 51 of the head IC chip 11, and the Au bumps 51 ultrasonically oscillate against the Au pads 61. Thus, the Au bumps 51 are bonded to the Au pads 61.

The portion 151a of the adhesive 151 exposed out of the rim of the head IC chip 11 is further hardened. In FIG. 15, reference numeral 153 indicates the further-hardened portion. Since the portion 151a exposed out of the rim of the head IC chip 11 is hardened, the adhesive 151 can be prevented from flowing out of the suspension 12 when the head IC chip 11 ultrasonically oscillates. Also, the adhesive 151 can be prevented from entering the contact portion between the bonding tool 112 and the head IC chip 11. Thus, a preferable contact condition can be maintained between the bonding tool 112 and the head IC chip 11.

The ultraviolet rays 108 do not enter the bottom of the head IC chip 11. Accordingly, the portion of the adhesive 151 situated below the head IC chip 11 has not been hardened at this point. The Au bumps 51 are properly pressed against the Au pads 61. Thus, the bonding condition between the Au bumps 51 and the Au pads 61 can be desirably maintained.

Figure 16:
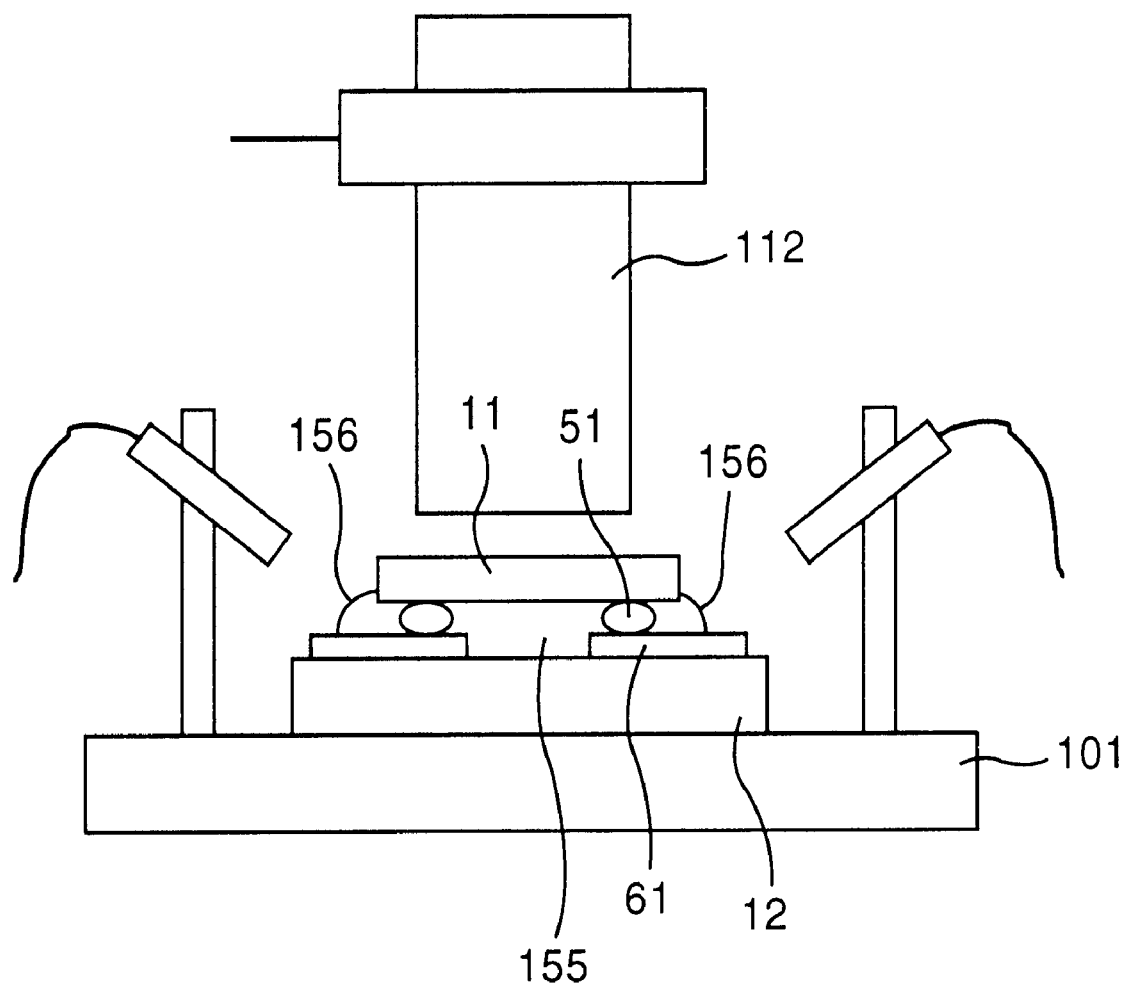
FIG. 16 illustrates a situation immediately after the pressing, ultrasonic oscillation, and ultraviolet ray irradiation step.

FIG. 16 illustrates a situation immediately after the pressing, ultrasonic oscillation, and ultraviolet ray irradiation step 146. The ultraviolet lamps 104 to 107 are switched off, and the Au bumps 51 are bonded to the Au pads 61. The adhesive 151 fills the small space 152 between the lower surface of the head IC chip 11 and the upper surface of the suspension 12, and only the portion 151a exposed out of the rim of the head IC chip 11 has been hardened.

Heating Step 147

The suspension 12, to which the head IC chip 11 is bonded, is taken out of the chip mounting device 100, The suspension 12 is then placed into a heating furnace to thermally harden the adhesive 151. At this point, the entire adhesive 151 is completely hardened to form an underfill 155.

Figure 17A:
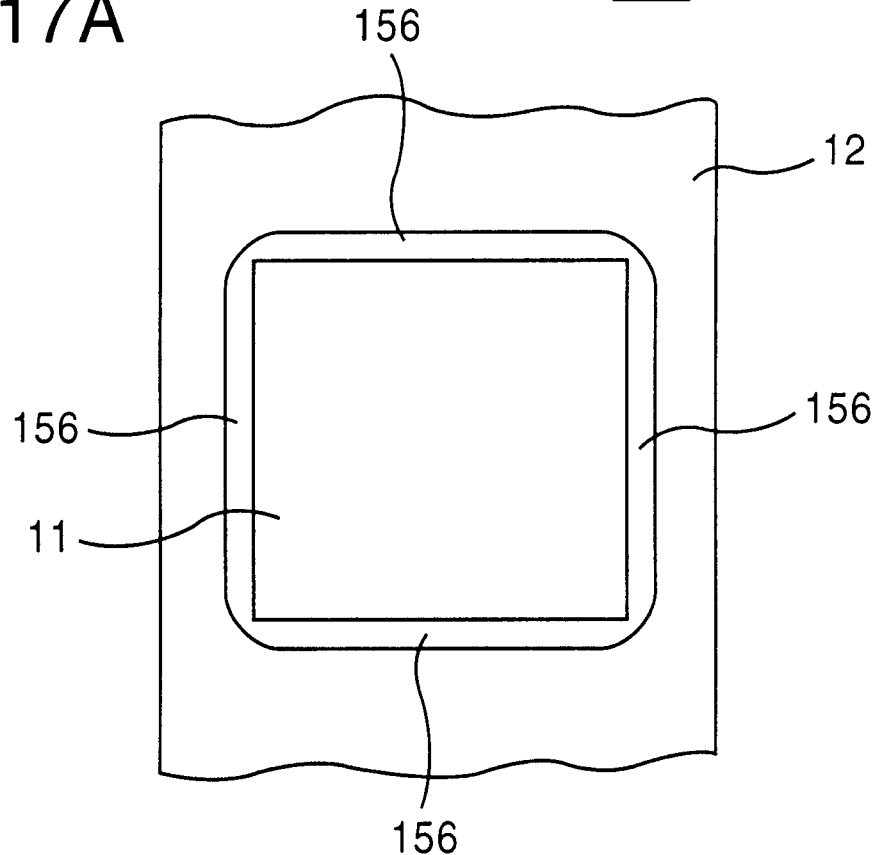
FIGS. 17A and 17B illustrate a part of the completed head slider assembly by the procedures shown in FIG. 11.
Figure 17B:
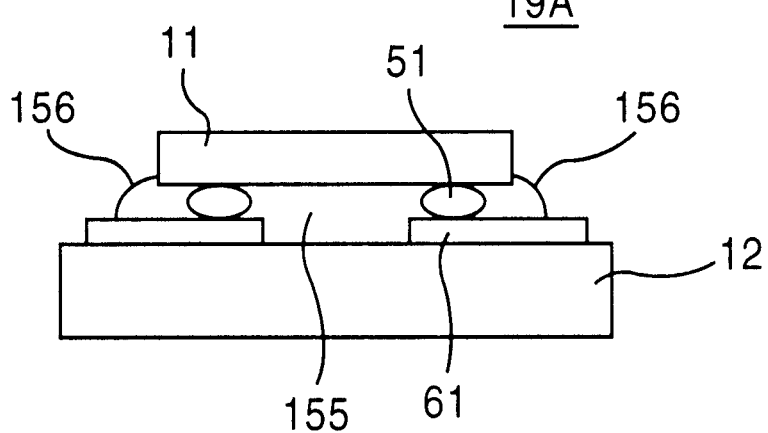

Through the above steps, a head slider assembly 19A shown in FIGS. 17A and 17B are completed. The Au bumps 22 formed on the lower surface of the head IC chip 11 are bonded to the Au pads 61 on the suspension 12. The head IC chip 11 is also bonded to the suspension by the underfill 155, which is formed by hardening the ultraviolet curing and thermosetting adhesive 150. The underfill 155 has a desirable fillet 156 on its entire peripheral portion. Since the adhesive 150 is applied first, the underfill 155 has high quality without voids.

A second embodiment of the present invention is a modification of the first embodiment, and solves the problem that the shape of the fillet of the underfill may vary.

Figure 18A:
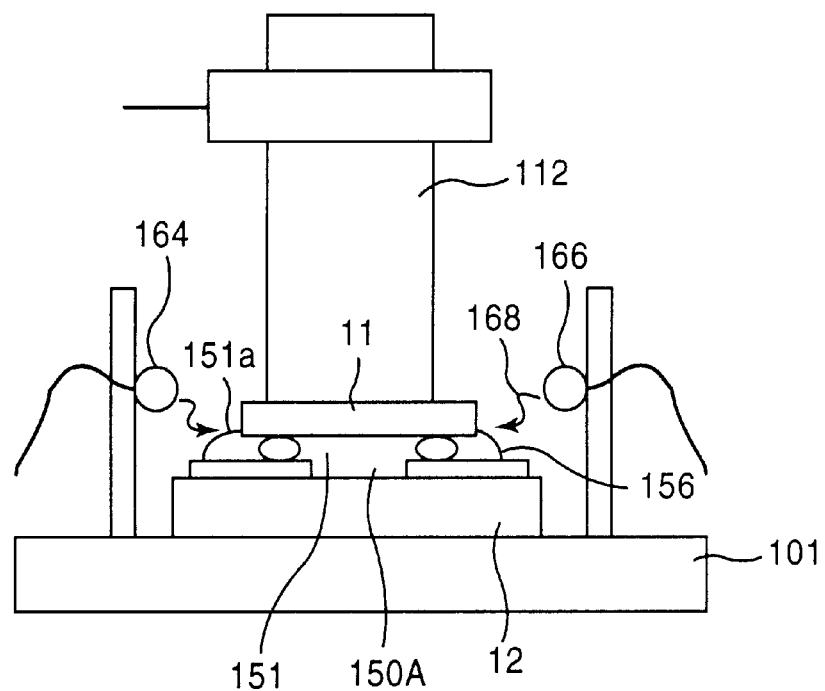
FIGS. 18A and 18B illustrate a chip mounting device of a second embodiment of the present invention.
Figure 18B:
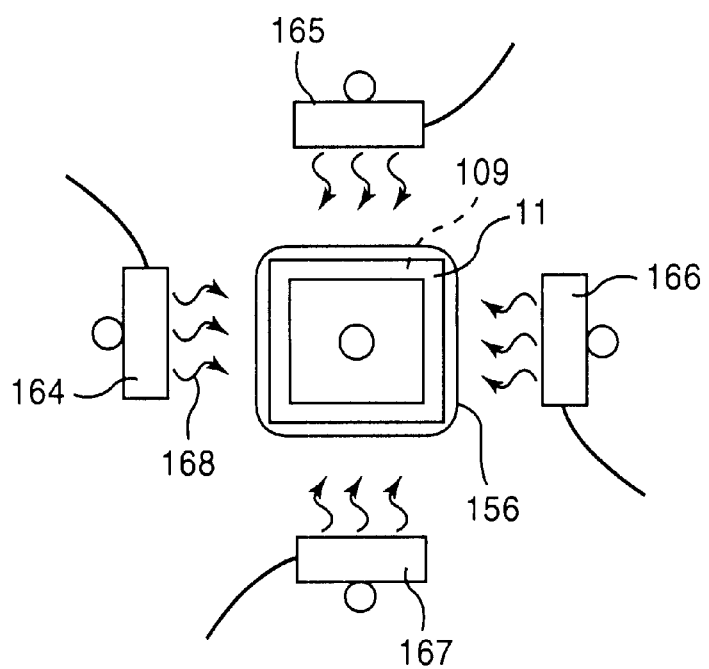

FIGS. 18A and 18B illustrate a chip mounting device 100 of the second embodiment of the present invention. The chip mounting device 100A is provided with heaters 164 to 167 in place of the ultraviolet lamps 104 to 107 of the chip mounting device 100 shown in FIGS. 9A and 9B. The heaters 164 to 167 surround the chip mounting position 109, and are arranged so as to irradiate all the sides of the head IC chip 11 with thermal rays 168.

As for the adhesive, thermosetting adhesive 150A is used.

When the head IC chip 11 is pressed against the suspension 12 and when the head IC chip 11 is subjected to an ultrasonic wave, the heaters 164 to 167 are switched on to irradiate the portion 151a of the thermosetting adhesive 150A exposed out of the rim of the head IC chip 11 with the thermal rays 168, thereby hardening the exposed portion 151a. Thus, the adhesive 150A can be prevented from flowing out of the suspension 12, and an excellent fillet 156 can be formed.

Third, fourth and fifth embodiments solve the problem that the overflowing adhesive sticks to the bonding tool.

Figure 19A:
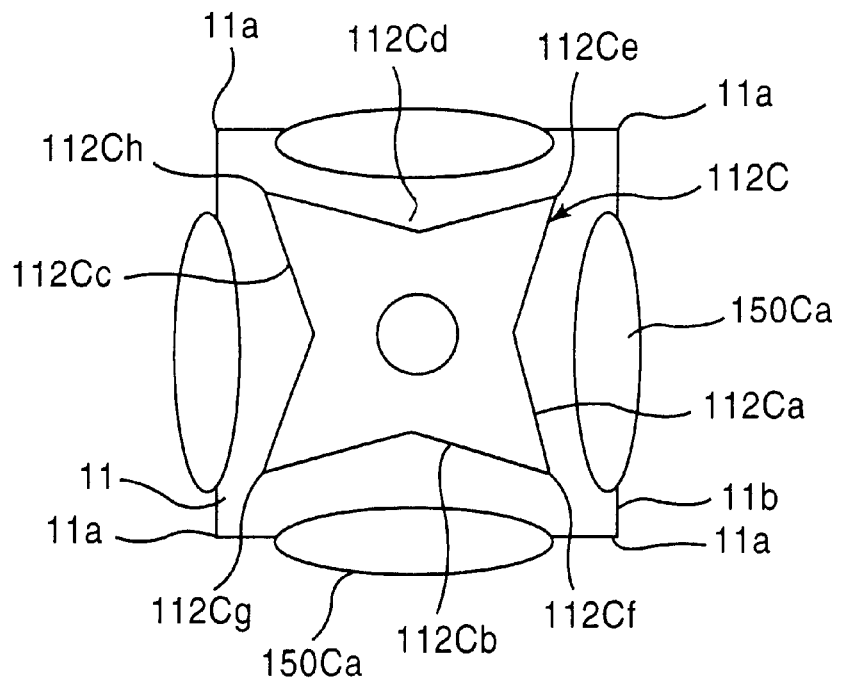
FIGS. 19A and 19B illustrate a chip mounting device of a third embodiment of the present invention.
Figure 19B:
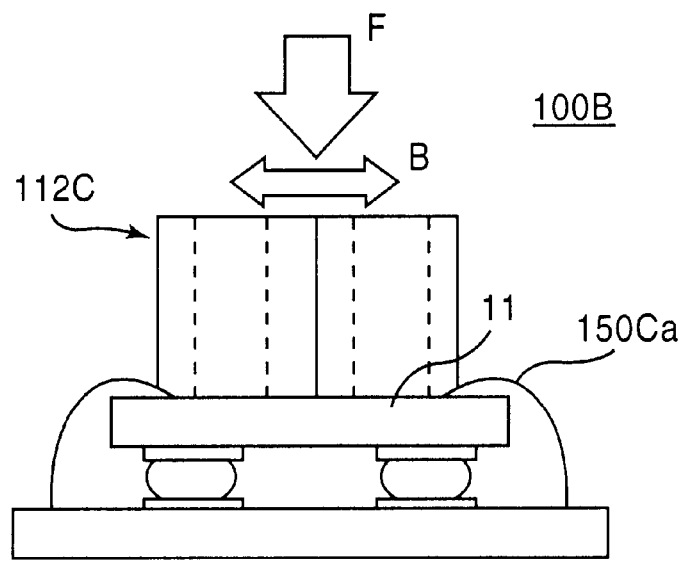

FIGS. 19A and 19B illustrate a chip mounting device 100B of the third embodiment of the present invention. The chip mounting device 100B does not include the ultraviolet lamps 104 to 107 and the controller 134 of the chip mounting device 100 shown in FIGS. 9A and 9B, and is provided with a bonding tool 112C shown in FIG. 20 instead of the bonding tool 112.

The bonding tool 112C is made of stainless steel, and takes the form of a pillar. The section of the bonding tool 112C has a square shape corresponding to the shape of the head IC chip 11. Also, the bonding tool 112C is the same size as the conventional bonding tool 112. The bonding tool 112C differs from the bonding tool 112 in that it has V-shaped sides. In other words, the bonding tool 112C is basically a square pole having four V-shaped side surfaces 112Ca to 112Cd and four corners 112Ce to 112Ch. The side surfaces 112Ca to 112Cd are bent inward with respect to the virtual flat surfaces between every two adjacent corners of the corners 112Ce to 112Ch.

As shown in FIG. 19A, the bonding tool 112C sucks the head IC chip 11 so that the heat IC chip 11 presses against the suspension 12, with the corners 112Ce to 112Ch corresponding to the corners 11a of the head IC chip 11. The side surfaces 112Ca to 112Cd of the bonding tool 112C are bent toward the center of the head IC chip 11 with respect to the sides 11b of the head IC chip 11.

When the head IC chip 11 is pressed by the bonding tool 112C, adhesive 150C might overflow onto the upper surface of the head IC chip 11 from underneath. In FIGS. 19A and 19B, the overflowing portion of the adhesive 150C is indicated by reference numeral 150Ca. The applied adhesive 150C is circular in shape when seen from above, and the overflowing portion should be radially spread. Accordingly, the overflowing portion 150Ca of the adhesive 150C on the upper surface of the head IC chip 11 is situated on the sides 11b of the head IC chip 11.

Since the side surfaces 112Ca to 112Cd of the bonding tool 112C are bent toward the center of the head IC chip 11, the overflowing portion 150Ca of the adhesive 150C does not stick to the side surfaces 112Ca to 112Cd of the bonding tool 112C. Accordingly, the top end of the bonding tool 112C is always kept clean, and there is no need to take trouble to clean the top end of the bonding tool 112C every time the mounting of one head IC chip 11 is completed.

To prevent the overflowing portion of the adhesive on the upper surface of the head IC chip 11 from sticking to the top end of the bonding tool, it is also possible to form the top end of the bonding tool into a square shape and make the bonding tool much smaller than the head IC chip 11. In that case, however, the bonding tool presses the center of the head IC chip 11, and the pressure of the bonding tool concentrates on the center of the head IC chip 11. As a result, cracks will occur in the head IC chip 11.

Since the bonding tool 112C is substantially the same size as the conventional bonding tool 112, the four corners 112Ce to 112Ch presses the neighboring areas of the corners 11a of the head IC chip 11. Accordingly, as with the conventional bonding tool 112, the bonding tool 112C presses the entire upper surface of the head IC chip 11, so that no cracks occur in the head IC chip 11.

Figure 20:
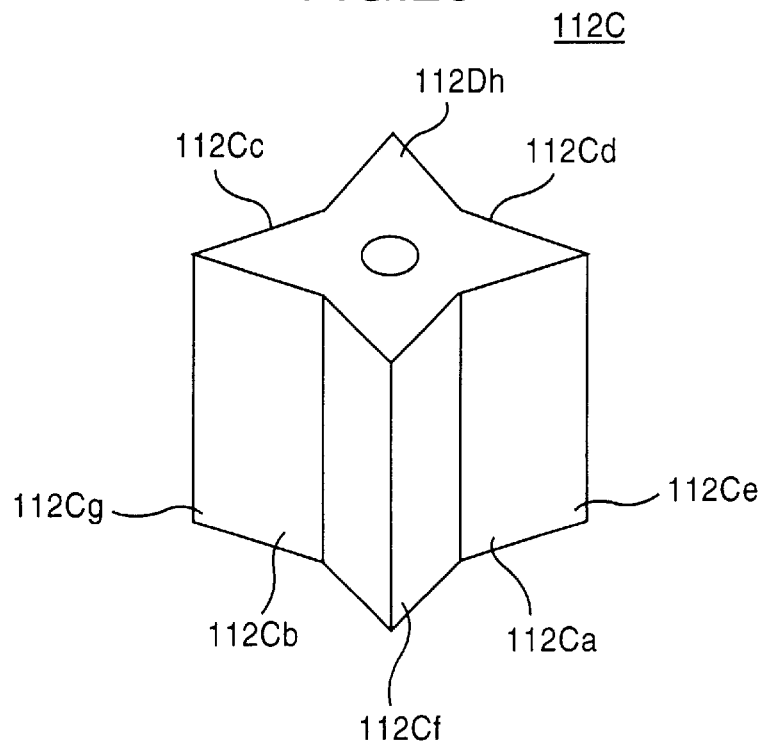
FIG. 20 illustrates the top end of a bonding tool show in FIGS. 19A and 19B.
Figure 21:
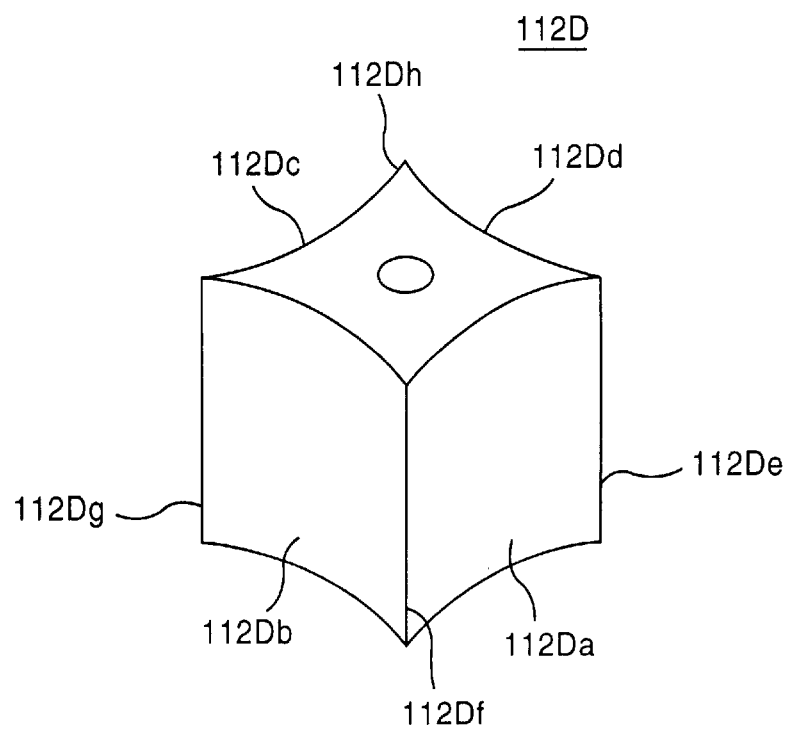
FIG. 21 illustrates a first modification of the bonding tool of FIG. 20.
Figure 22:
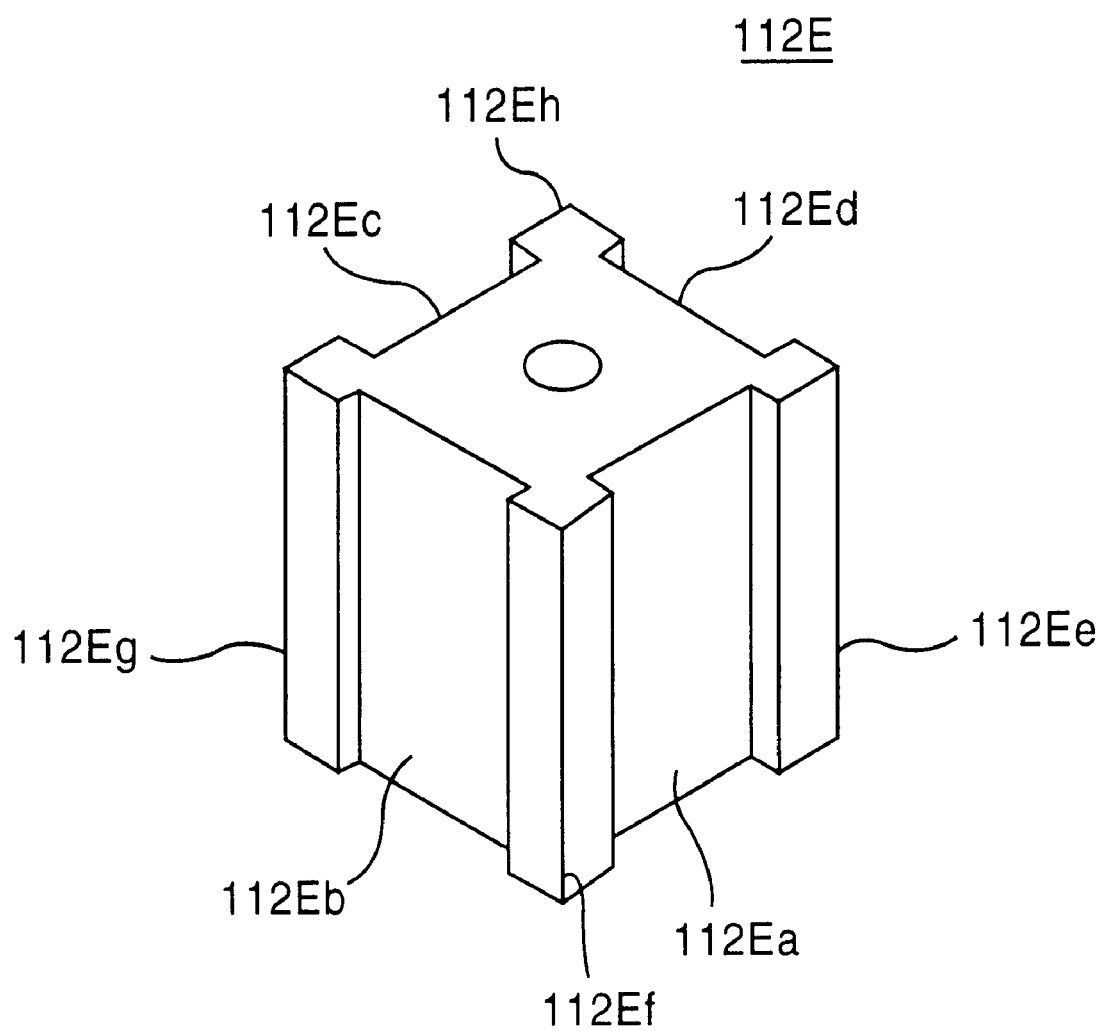
FIG. 22 illustrates a second modification of the bonding tool of FIG. 20.

Instead of the bonding tool 112C shown in FIG. 20, a bonding tool 112D shown in FIG. 21 or a bonding tool 112E shown in FIG. 22 can be employed.

The bonding tool 112D shown in FIG. 21 has four corners 112De to 112Dh and four curved side surfaces 112Da to 112Dd. The side surfaces 112Da to 112Dd are bent inward with respect to the virtual flat surfaces between the adjacent comers 112De to 112Dh.

The bonding tool 112E has four corners 112Ee to 112Eh and four curved side surfaces 112Ea to 112Ed. The side surfaces 112Ea to 112Ed are bent inward with respect to the virtual flat surfaces between the adjacent corners 112Ee to 112Eh.

With either the bonding tool 112D shown in FIG. 21 or the bonding tool 112E shown in FIG. 22, the same effects can be obtained as with the bonding tool 112C shown in FIG. 20.

A fourth embodiment of the present invention solves the problem that the conductivity of ultrasonic waves from the tool to the head IC chip is low.

FIGS. 23A and 23B show a chip mounting device 100F of the fourth embodiment of the present invention. The chip mounting device 100F is provided with a polyimide film supporting mechanism 170 on the stage 101, instead of the ultraviolet lamps 104 to 107 of the chip mounting device 100 shown in FIGS. 9A and 9B. In FIGS. 23A and 23B, the same components as in FIGS. 9A and 9B are indicated by the same reference numerals, and the descriptions for those components are omitted. The width direction of the chip mounting device 100F are indicated by X1 and X2, and the depth direction of the chip mounting device 100F are indicated by Z1 and Z2.

Figure 24:
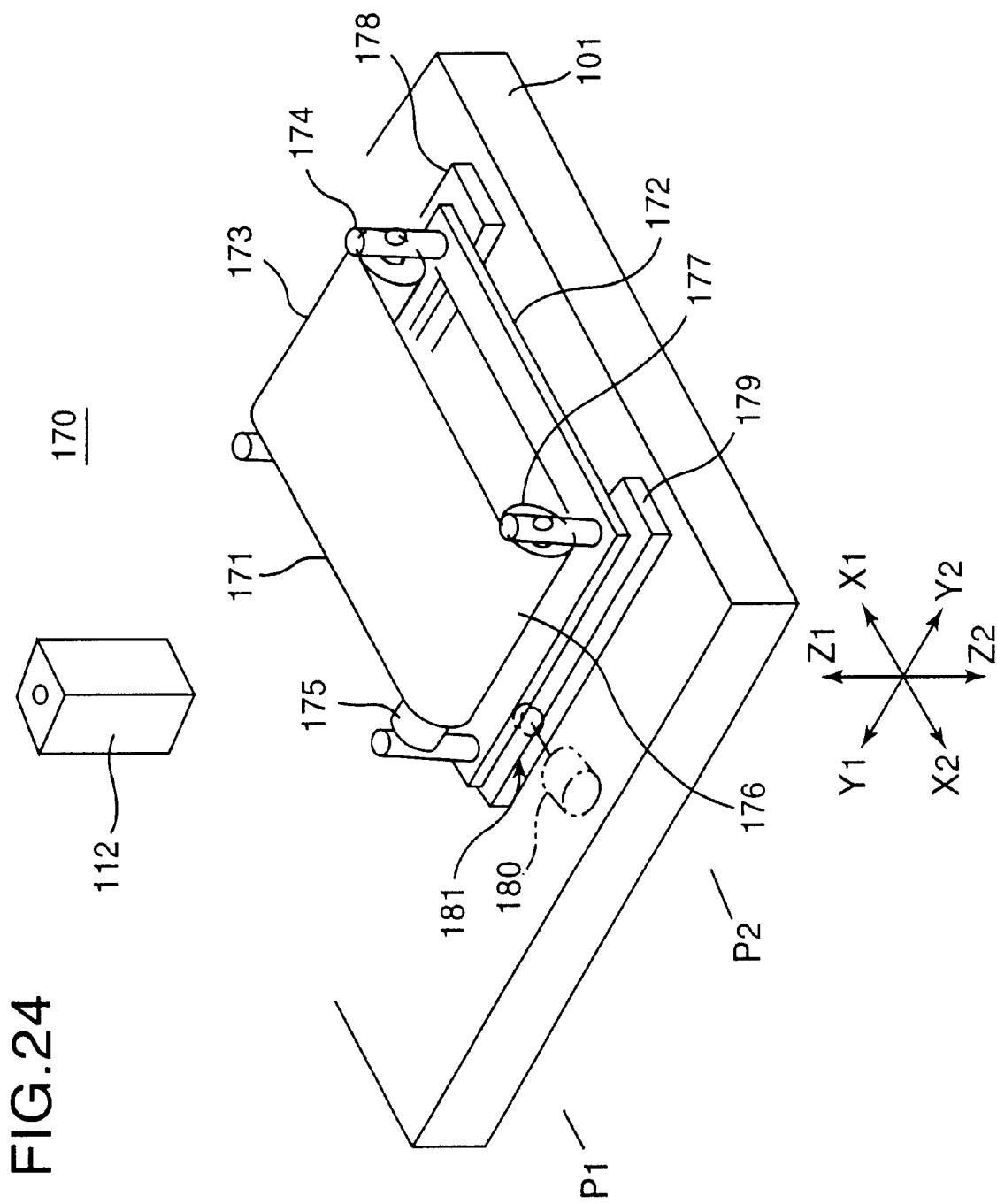
FIG. 24 illustrates a polyimide film supporting mechanism shown in FIGS. 23A and 23B.

As shown in FIG. 24, the polyimide film supporting mechanism 170 comprises a U-shaped frame 172, a feeding roller supporting member 174 that is disposed at the X1 side of the frame 172 and supports a feeding roller 173 for feeding tape-type polyimide film 171, and a winding roller supporting member 174 that is disposed at the X2 side of the frame 172 and supports a motor 175 and a winding roller 176. The U-shaped frame 172 is movable along guide rails 178 and 179 on the stage 101 in the Y1–Y2 directions. A moving mechanism 181 containing a motor 180 moves the frame 172 between an interposing position P1 below the bonding tool 112 and a retracting position P2 shifted from the interposing position P1 in the Y2 direction. The tape-type polyimide film 171 horizontally extends between the feeding roller 173 and the winding roller 176 at the same height P3 as the upper surface of the mounted head IC chip 11.

A control unit 130F comprises a controller 190 for controlling the motor 180 and a controller 191 for controlling the motor 175, instead of the controller 134 shown in FIG. 9B.

Figure 25:
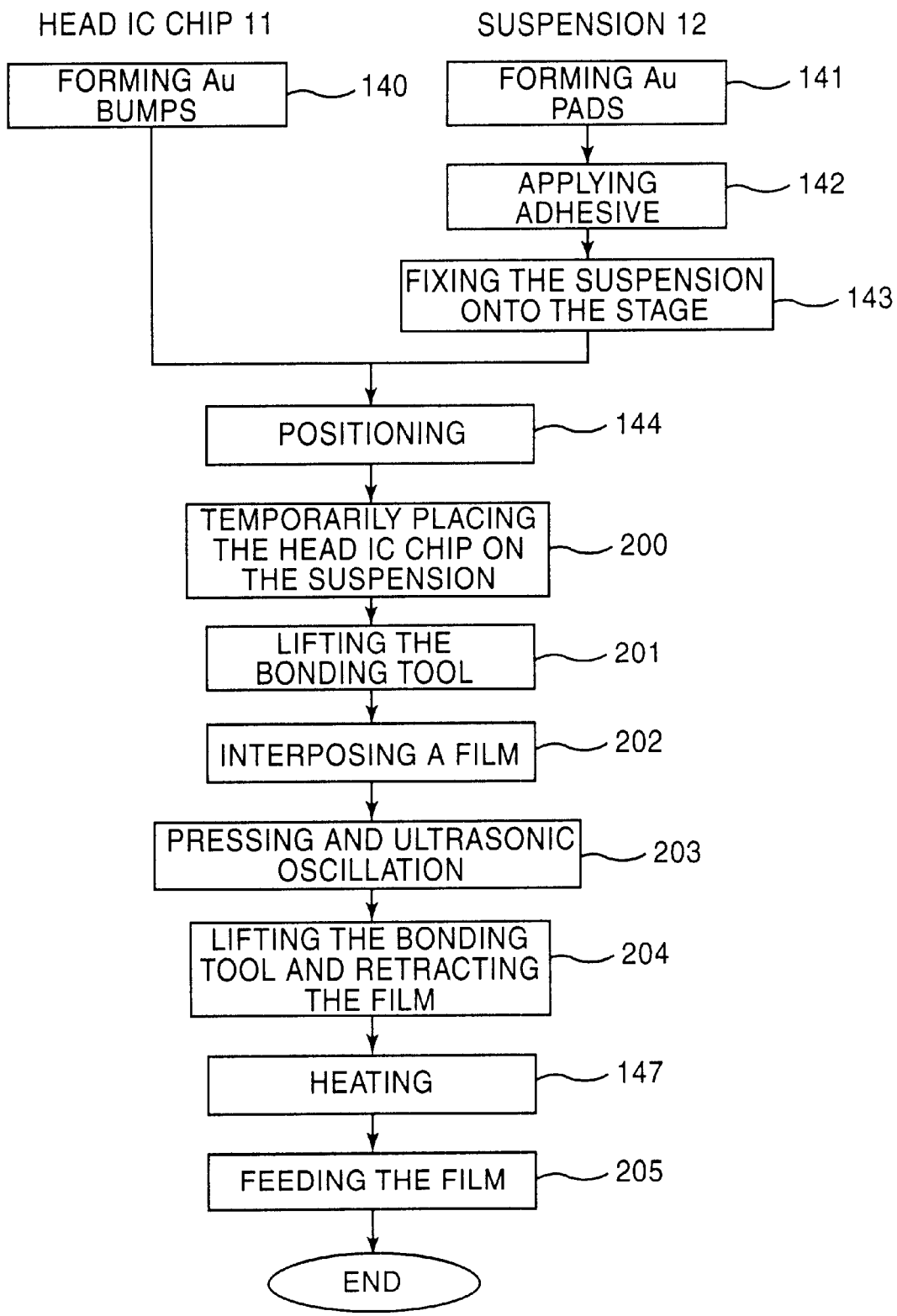
FIG. 25 is a flowchart of a method of manufacturing the head slider assembly of FIG. 2 using the chip mounting device of FIGS. 23A and 23B.

Referring now to FIG. 25, a method of manufacturing the head slider assembly 19 of FIG. 2 using the above chip mounting device 100F will be described below.

The head slider assembly 19 is manufactured by carrying out steps 140 to 144, 147, and 200 to 205. Among those steps 140 to 144, 147, and 200 to 205, steps 144 and 200 to 205 are carried out by the chip mounting device 100F operating as shown in FIGS. 26A to 26F.

The polyimide film supporting mechanism 170 is located at the retracting position P2 shown in FIGS. 23B and 24. Steps 140 to 144 are carried out in the same manner as in the procedures shown in FIG. 11.

Figure 27:
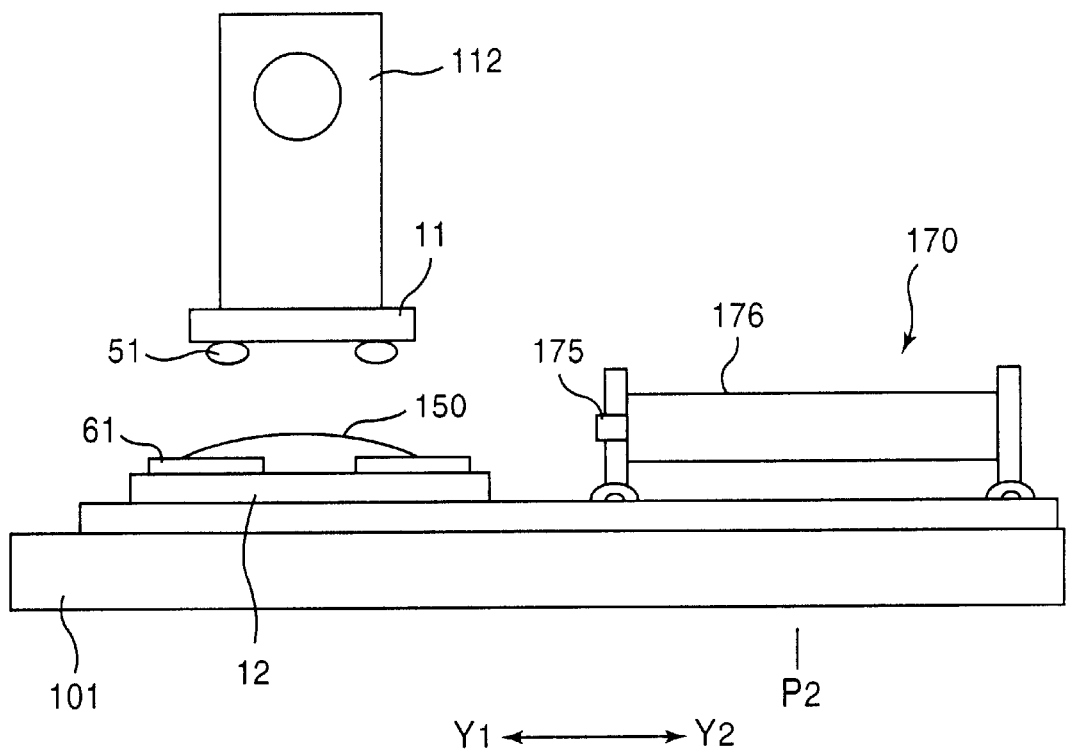
FIG. 27 illustrates a situation after a chip positioning step in the procedures of FIG. 25.

FIG. 27 illustrates a situation after the positioning step 144. In FIG. 27, the top end of the bonding tool 112 vacuum-sucks one head IC chip 11, and stops at a predetermined position so that the head IC chip 11 is positioned to the suspension 12 fixed onto the stage 101.

Figure 26:
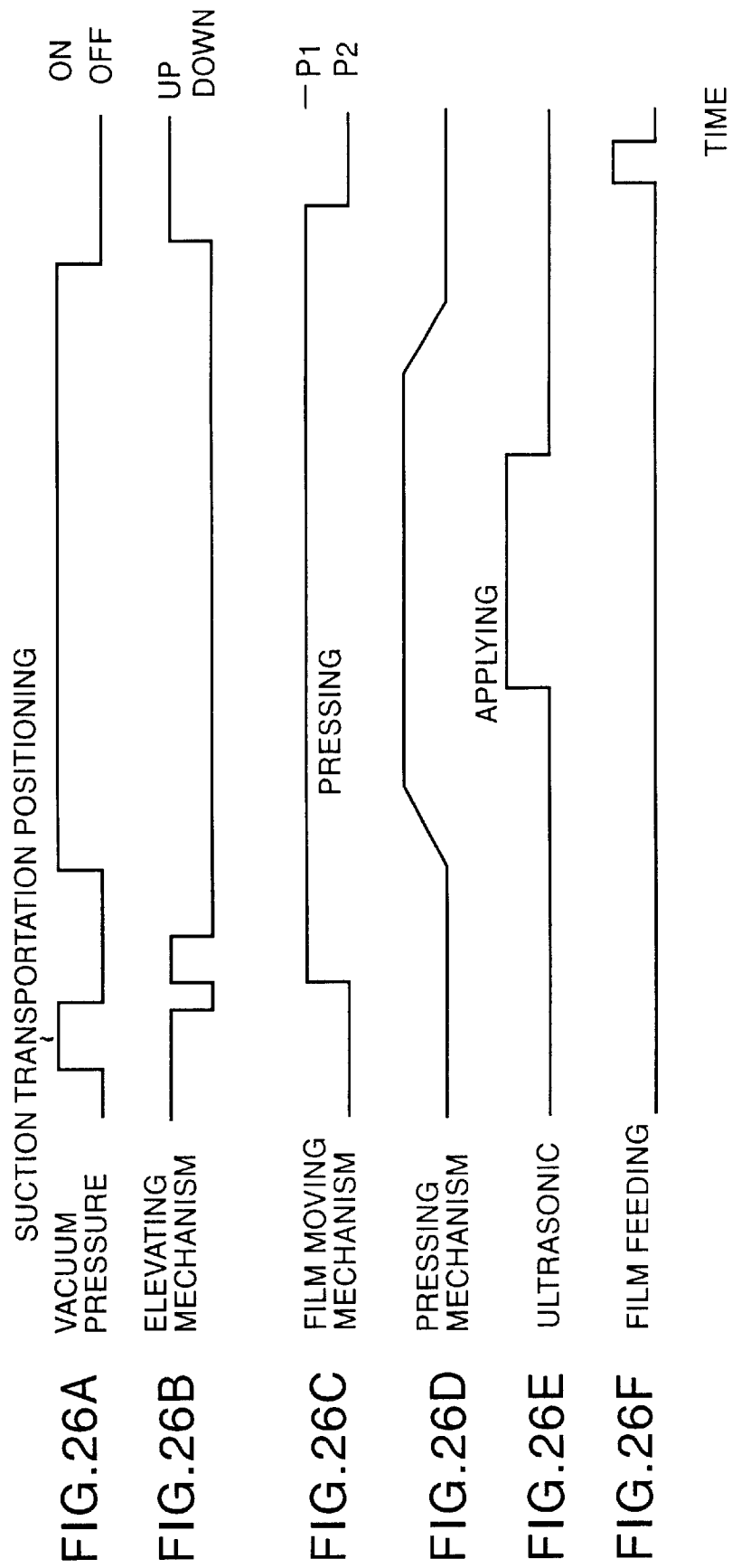
FIGS. 26A to 26F are timing chart of the operation of the chip mounting device of FIGS. 23A and 23B.
Figure 28:
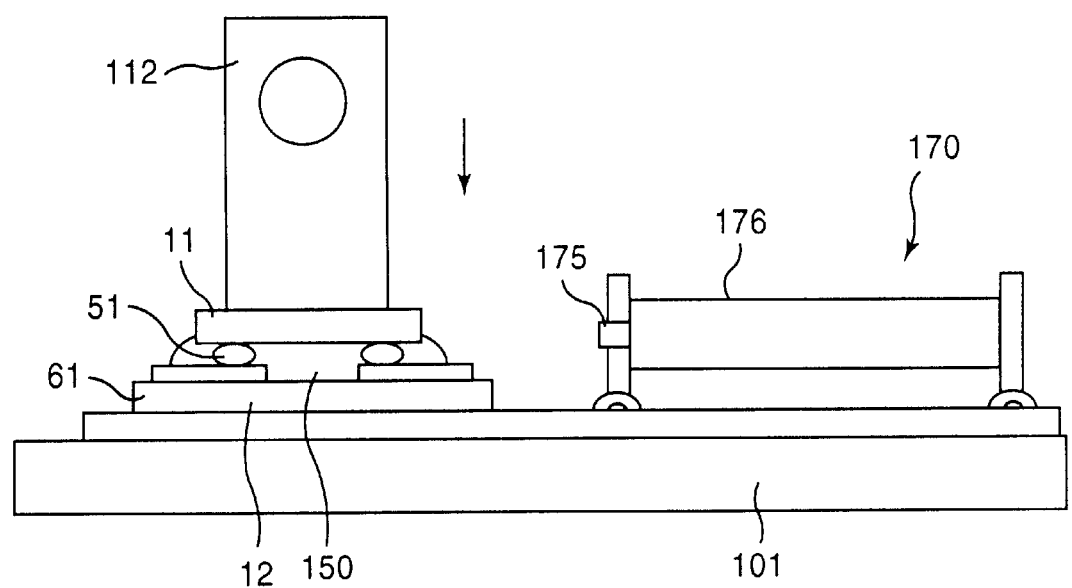
FIG. 28 illustrates a temporary placing step in the procedures of FIG. 25.

Temporary Placing Step 200 (see FIGS. 28, 26A, and 26B)

As an elevating mechanism (not shown) is actuated, the bonding tool 112 is moved down so that the head IC chip 11 spreads out the adhesive 150. Accordingly, the head IC chip 11 is positioned and bonded to the suspension 12 by the adhesive 150. Thus, the head IC chip 11 is temporarily placed on the suspension 12.

Figure 29:
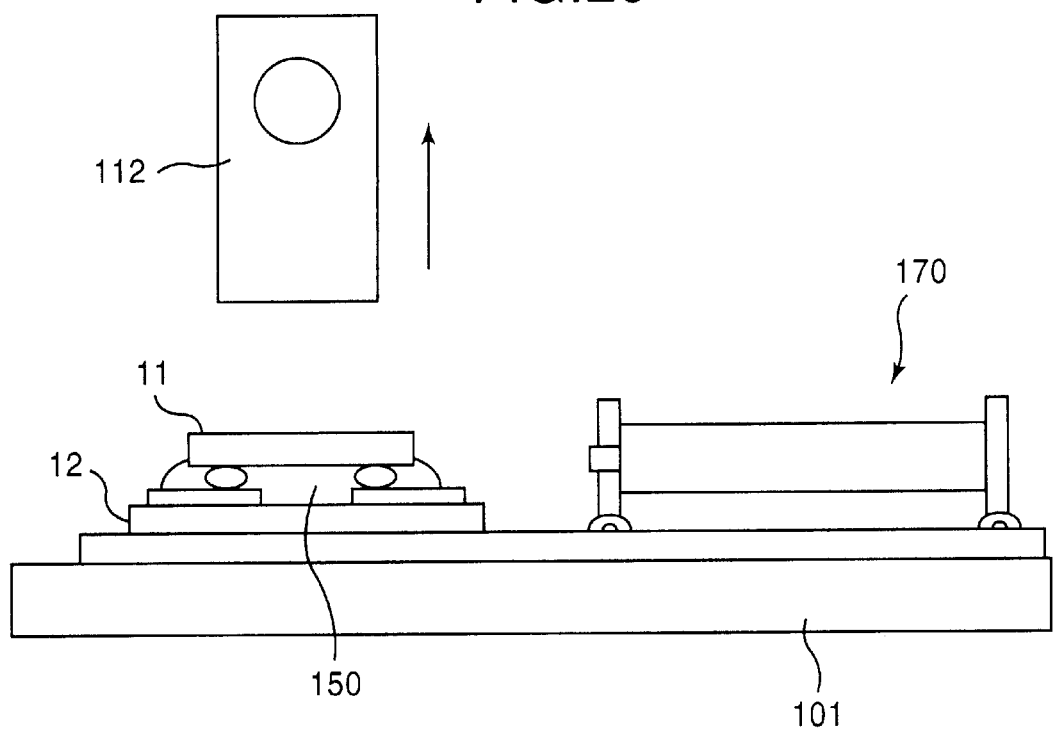
FIG. 29 illustrates a bonding tool lifting step in the procedures of FIG. 25.

Bonding Tool Lifting Step 201 (see FIGS. 29, 26A, and 26B)

As shown in FIG. 26A, the valve 115 is closed to stop the vacuum suction. As shown in FIGS. 28 and 26B, the bonding tool 112 is moved upward by the elevating mechanism (not shown), leaving the head IC chip 11 on the suspension 12.

Figure 30:
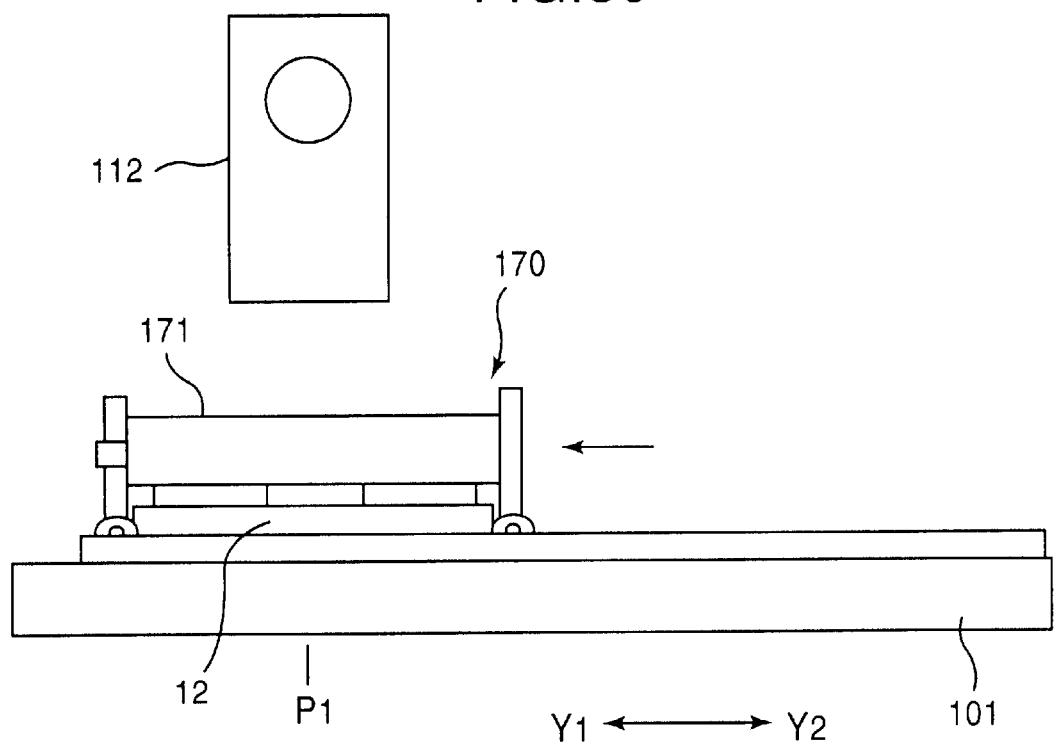
FIG. 30 illustrates a polyimide film interposing step in the procedures of FIG. 25.

Polyimide Film Interposing Step 202 (see FIGS. 30 and 26C)

As shown in FIG. 26C, the motor 180 is driven by the controller 190, and the polyimide film supporting mechanism 170 is moved in the Y1 direction by the moving mechanism 181. The polyimide film supporting mechanism 170 is moved to the interposing position PI as shown in FIG. 30, so that the polyimide film 171 covers the head IC chip 11.

Figure 31:
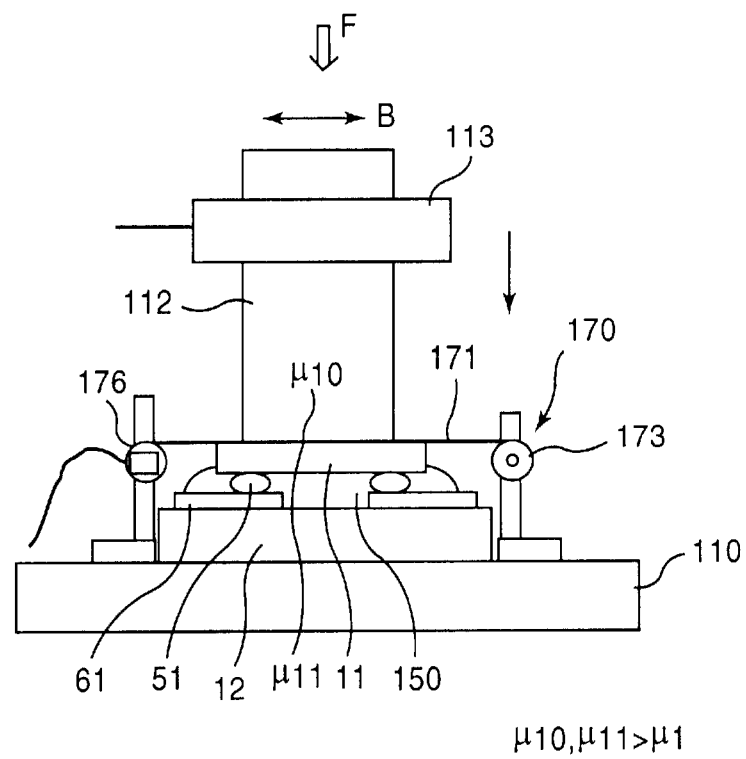
FIG. 31 illustrates a pressing and ultrasonic oscillation step in the procedures of FIG. 25.

Pressing and ultrasonic oscillation Step 203 (see FIGS. 31, 26D, and 26E)

As the elevating mechanism (not shown) is actuated, the bonding tool 12 is moved down as shown in FIG. 26B. The load cell 114 operates as shown in FIG. 26D, in accordance with a control signal transmitted from the controller 132. As shown in FIG. 31, the lowered bonding tool 112 presses the head IC chip 11 by a predetermined force F via the polyimide film 171, so as to press the Au bumps 51 against the Au pads 61.

As shown in FIG. 26E, the ultrasonic oscillator 113 starts oscillating in accordance with a control signal transmitted from the controller 131, and the ultrasonic oscillator 113 keeps oscillating for several seconds. With the ultrasonic oscillator 113 oscillating, the bonding tool 112 ultrasonically oscillates in the directions of the arrow B as shown in FIG. 31. The ultrasonic oscillation of the bonding tool 112 is transmitted to the Au bumps 51 on the head IC chip 11 via the polyimide film 171. The Au bumps 51 in turn ultrasonically oscillate against the Au pads 61. Thus, the Au bumps 51 are bonded to the Au pads 61.

The friction coefficient $\mu 10$ between the stainless bonding tool 112 and the polyimide film 171 is in the range of 1 to 4, and the friction coefficient $\mu 11$ between the polyimide film 171 and the silicon head IC chip 11 is also in the range of 1 to 4. These friction coefficients $\mu 10$ and $\mu 11$ are greater than the friction coefficient $\mu 1$ between the tool 75 and the head IC chip 11. Accordingly, the transmission of ultrasonic waves from the bonding tool 112 to the head IC chip 11 can be carried out at a higher efficiency than in the prior art, and the bonding of the Au bumps 51 to the Au pads 61 can be completed in a shorter period of time than in the prior art.

Figure 32:
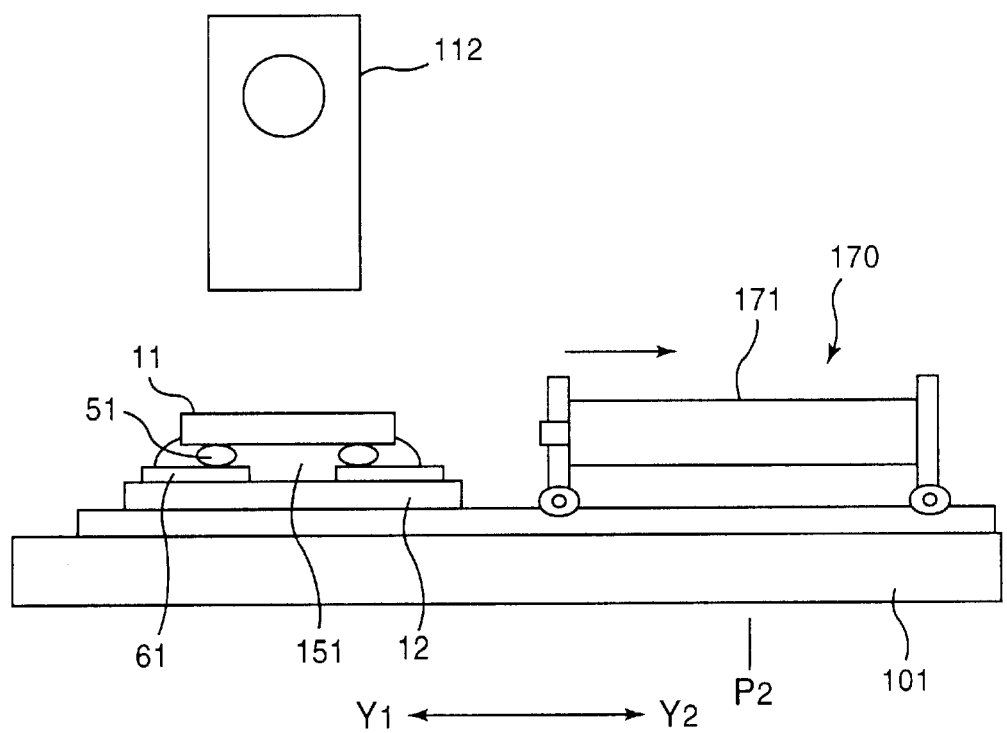
FIG. 32 illustrates a bonding tool lifting and polyimide film supporting mechanism retracting step in the procedures of FIG. 25.

Bonding Tool Lifting and Polyimide Film Supporting Mechanism Retracting Step 204 (see FIGS. 32, 26B, and 26C)

As the elevating mechanism (not shown) is actuated as shown in FIG. 26B, the bonding tool 112 is moved up, as shown in FIG. 32. As shown in FIG. 26C, the motor 180 is driven by the controller 190, and the polyimide film supporting mechanism 170 is moved in the Y2 direction by the moving mechanism 181. The polyimide film supporting mechanism 170 is moved back to the retracting position P2 as shown in FIG. 32, and the polyimide film 171 retracts from the head IC chip 11, leaving the head IC chip 11 in the exposed state.

Heating Step 147

Figure 4A:
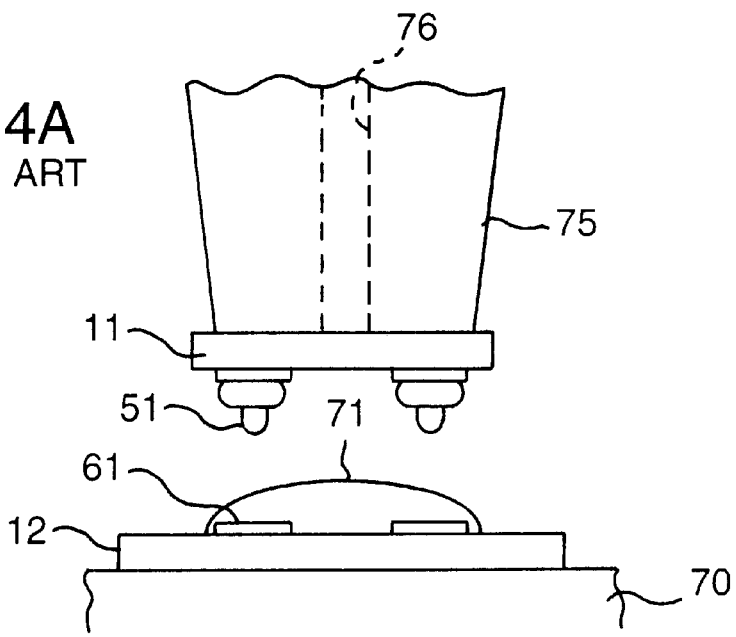
FIGS. 4A to 4C illustrate a method of producing a conventional semiconductor chip.
Figure 4B:
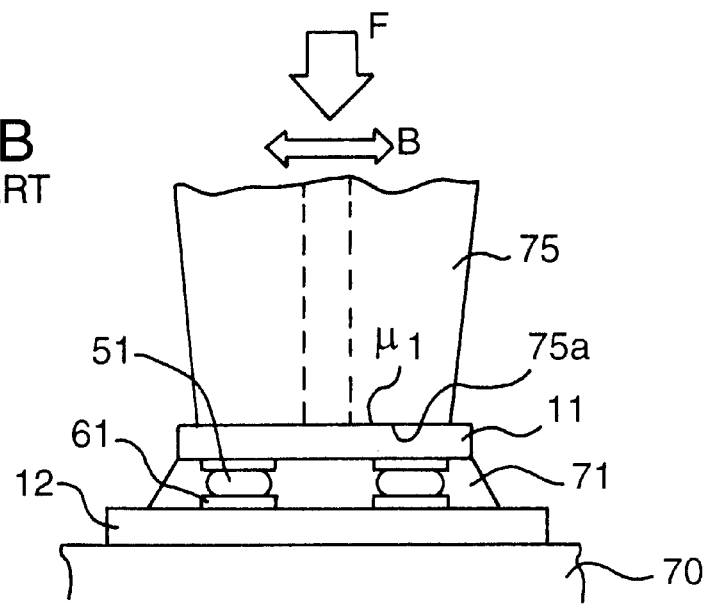
Figure 4C:
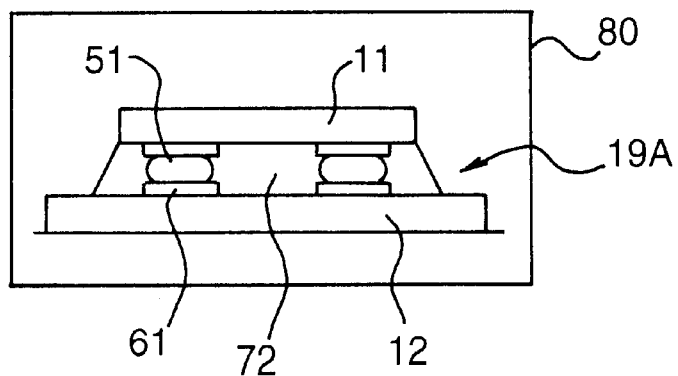
Figure 5A:
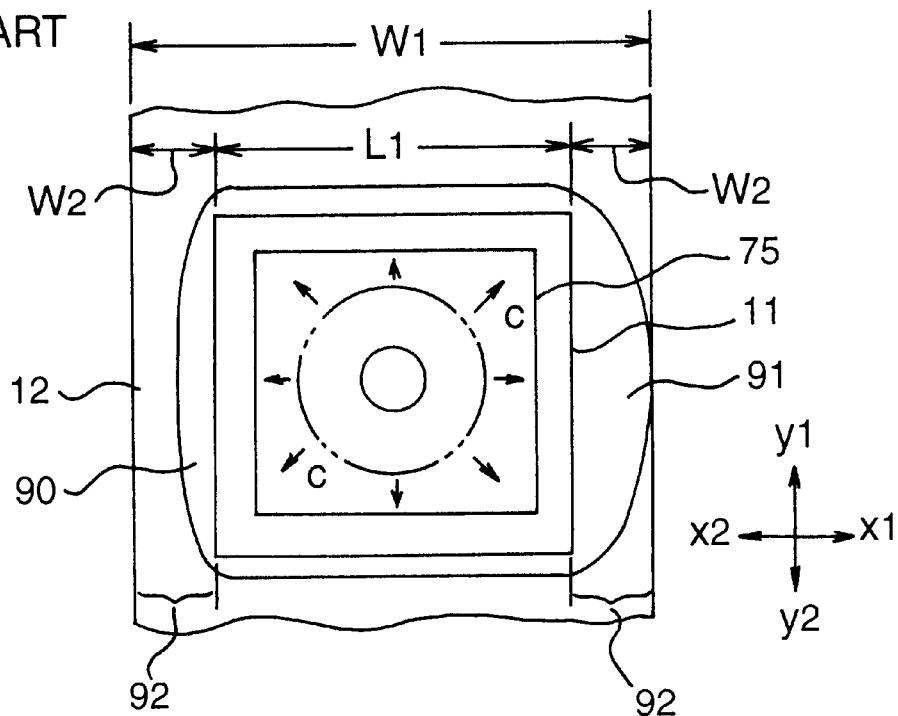
FIGS. 5A and 5B illustrate a first problem of the prior art.
Figure 5B:
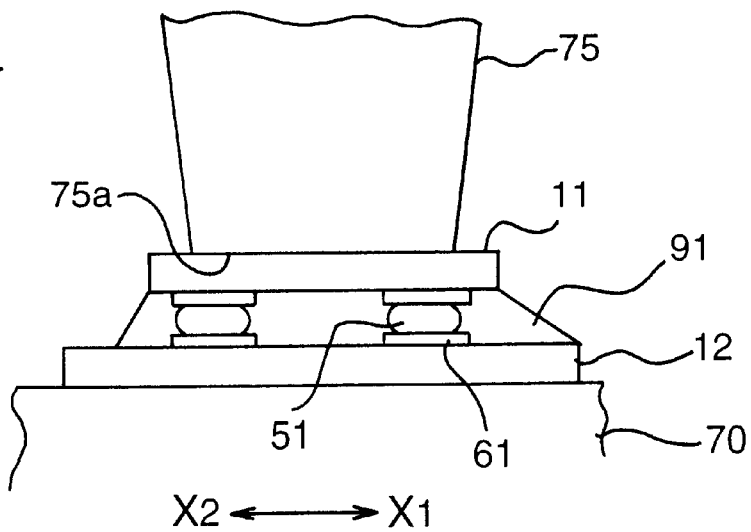
Figure 6A:
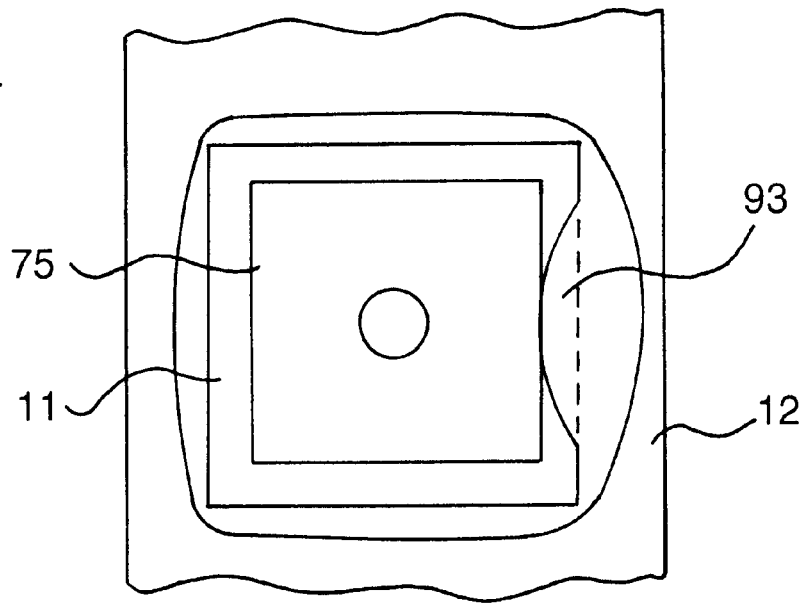
FIGS. 6A and 6B illustrate a second problem of the prior art.
Figure 6B:
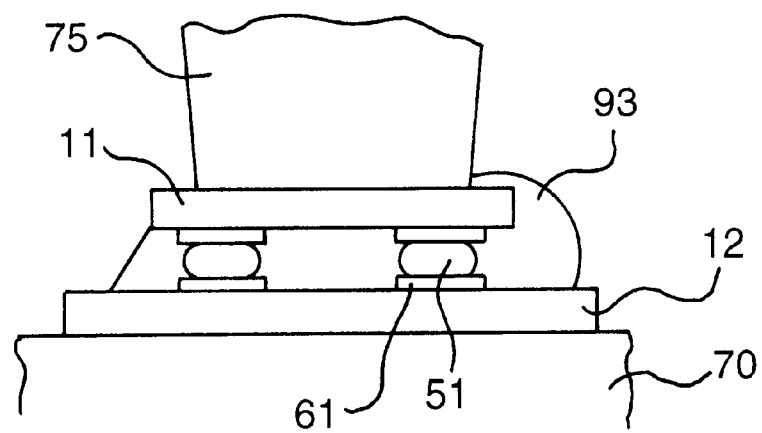
Figure 7A:
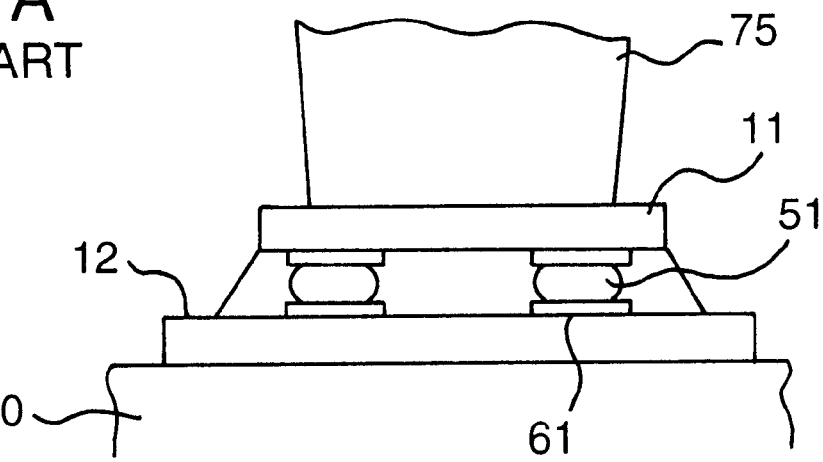
FIGS. 7A and 7B illustrate a fourth problem of the prior art.
Figure 7B:
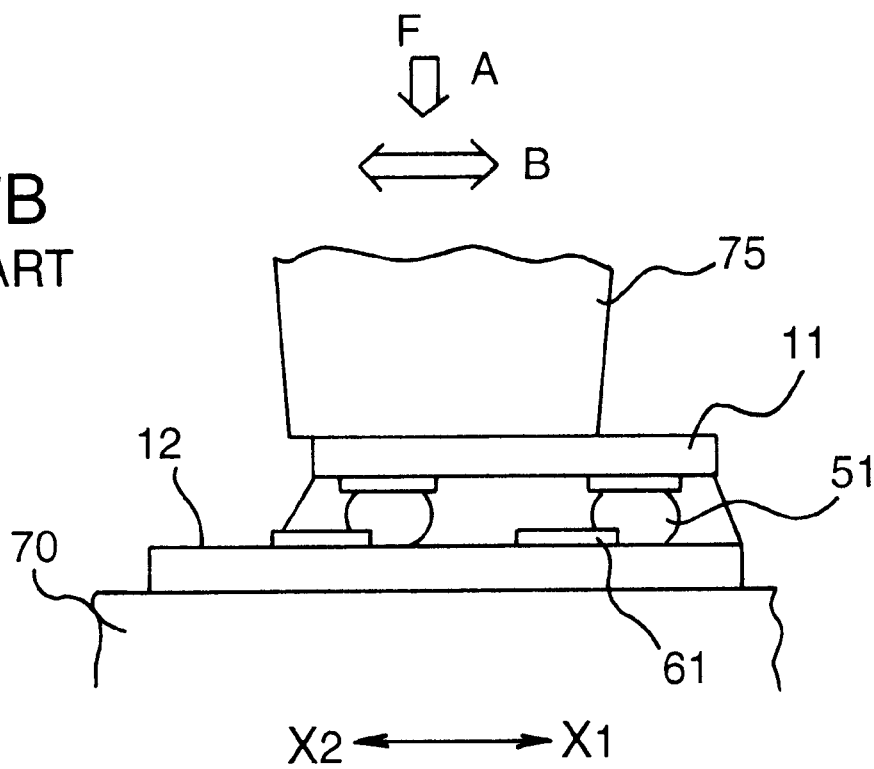
Figure 8:
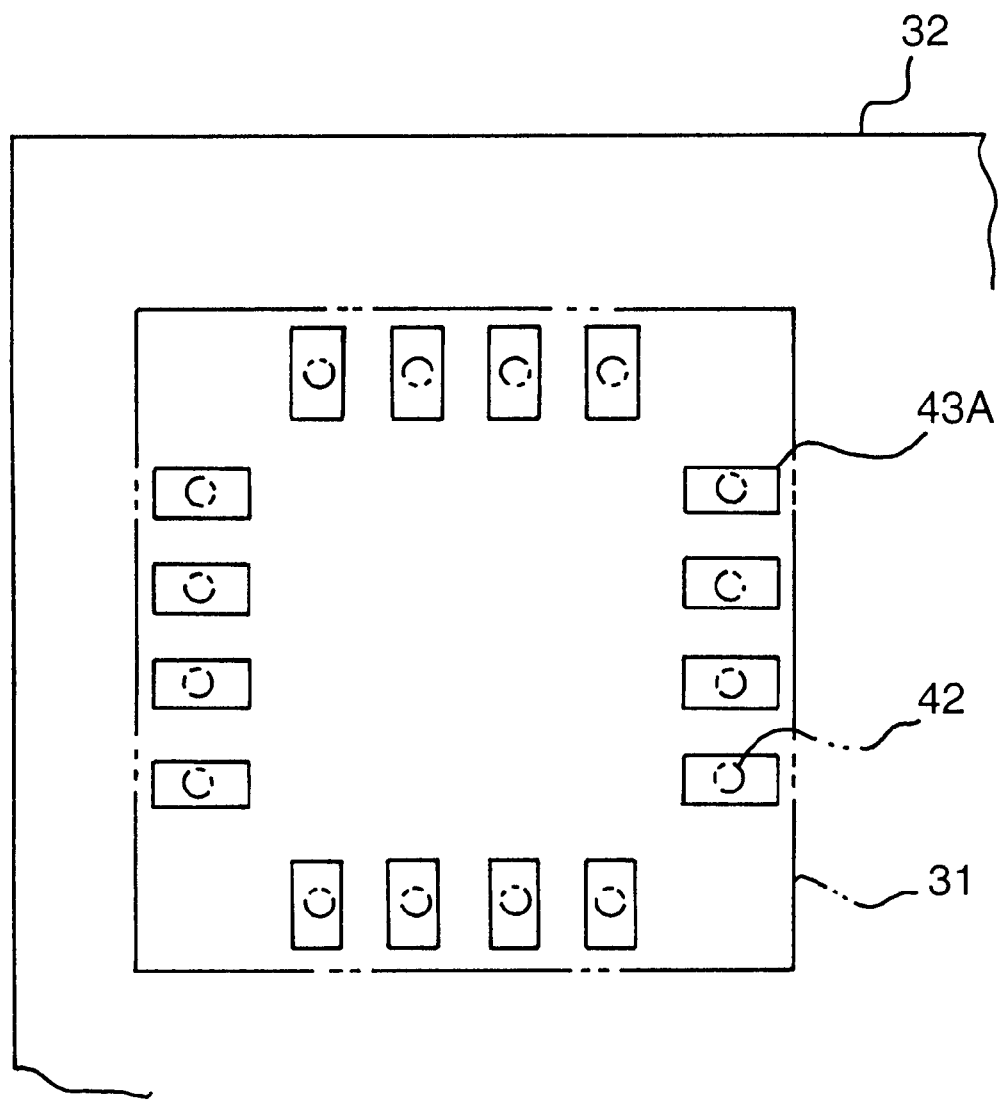
FIG. 8 illustrates rectangular pads of the prior art.
Figure 10:
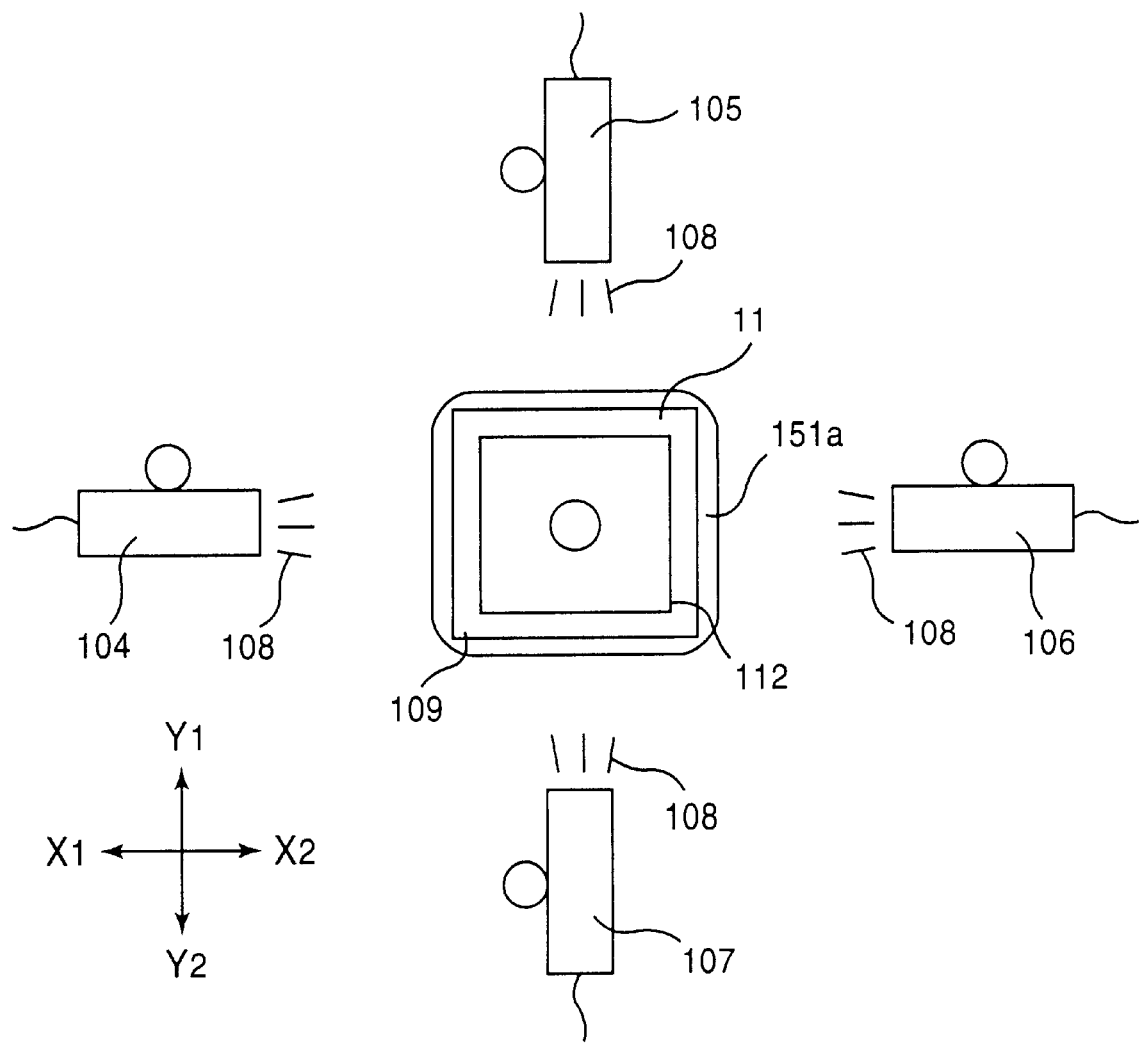
FIG. 10 is a plan view of the arrangement of ultraviolet lamps shown in FIGS. 9A and 9B.

The suspension 12, to which the head IC chip 11 is bonded, is taken out of the chip mounting device 110F, and placed into a heating furnace as shown in FIG. 4C. In the heating furnace, the entire adhesive 151 is thermally hardened. Thus, the head slider assembly 19A shown in FIGS. 17A and 17B is completed.

The adhesive 151 is turned into the underfill 155. The Au bumps 51 formed on the lower surface of the head IC chip 11 is bonded to the Au pads 61 on the suspension 12. The head IC chip 11 is bonded onto the suspension 12 by the underfill 155 formed by hardening the ultraviolet curing and thermosetting adhesive 150.

Figure 33A:
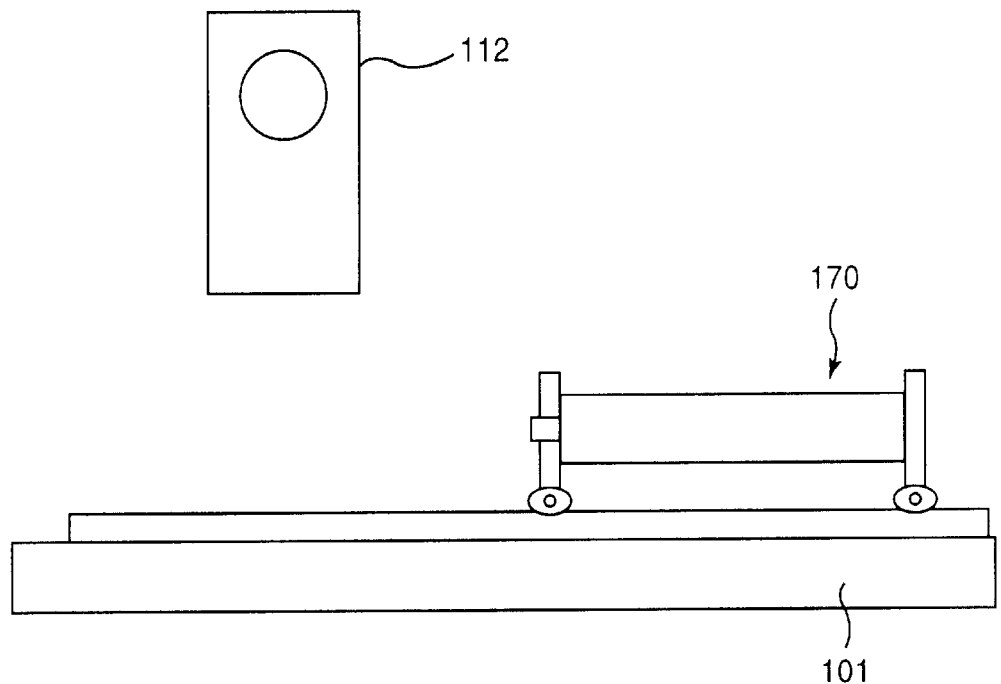
FIGS. 33A and 33B illustrate a polyimide film feeding step in the procedures of FIG. 25.
Figure 33B:
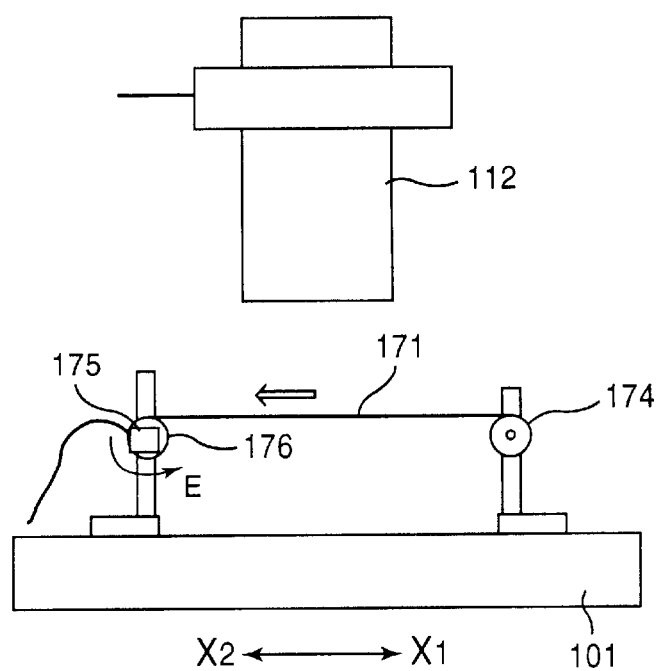

Polyimide Film Feeding Step 205 (see FIGS. 33A, 33B, and 26F)

As shown in FIG. 26F, the motor 175 is driven in accordance with a signal transmitted from the controller 191. As shown in FIGS. 33A and 33B, the winding roller 176 winds up the tape-type polyimide film 171 in the direction of the arrow E. The polyimide film 171 is then sent out in the X2 direction from the feeding roller 173. The tape-type polyimide film 171 is moved in the X2 direction by a length equivalent to the length of each side of the head IC chip 11. Thus, new polyimide film for the mounting of the next head IC chip is prepared.

In the above manner, the operation of the chip mounting device 100F is completed. In the above procedures, the pressing ultrasonic oscillation step 203 requires a shorter period of time than in the prior art. Accordingly, the head slider assembly can be manufactured at higher workability than in the prior art.

Since the bonding tool 112 applies a load and ultrasonic oscillation to the head IC chip 11 via the polyimide film 171 as shown in FIG. 31, the following two incidental effects can be attained:

1. Since the polyimide film 171 pressed by the bonding tool 112 consists of synthetic resin, the upper surface of the polyimide film 171 is deformed by the minute concavities and convexities of the end surface of the bonding tool 112. As a result, the end surface of the bonding tool 112 firmly adheres to the upper surface of the polyimide film 171. Thus, the orientation of the end surface of the bonding tool 112 can be eliminated. The lower surface of the polyimide film also firmly adheres to the upper surface of the head IC chip 11. When the bonding tool 112 ultrasonically oscillates, the head IC chip 11 returns to the original position from a displaced point. Thus, no deviation occurs in the position of head IC chip 11.

2. The polyimide film 171, that covers the upper surface of the head IC chip 11, prevents the overflowing adhesive from flowing onto the upper surface of the head IC chip 11.

A fifth embodiment of the present invention solves the problem that deviation of the head IC chip might result in defective mounting.

FIGS. 34A to 34D illustrate a head slider assembly 19G of the fifth embodiment of the present invention. The head slider assembly 19G positions the head IC chip 11 to a suspension 12G, as in the foregoing embodiments, and the bonding tool 112 applies a load and ultrasonic oscillation to the head IC chip 11. By doing so, the Au bumps 51 are bonded to Au pads 61G on the suspension 12G, and the head IC chip 11 is bonded to the suspension 12G by the hardened underfill 155.

Each of the Au pads 61 G has a length L20 in the direction of ultrasonic oscillation B (the X1–X2 direction) generated by the bonding tool 112 and a length L21 in the direction perpendicular to the direction of the ultrasonic oscillation B. The length L20 is four times as long as the length 21. Accordingly, each Au pad 61 G is elongated in the direction of the ultrasonic oscillation B.

Figure 34A:
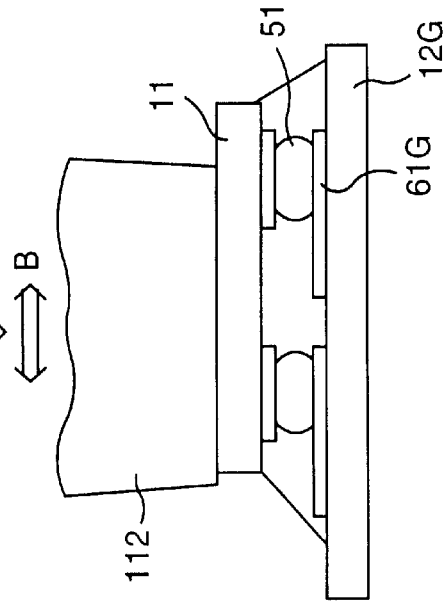
FIGS. 34A to 34D illustrates a head slider assembly of a fifth embodiment of the present invention.
Figure 34C:
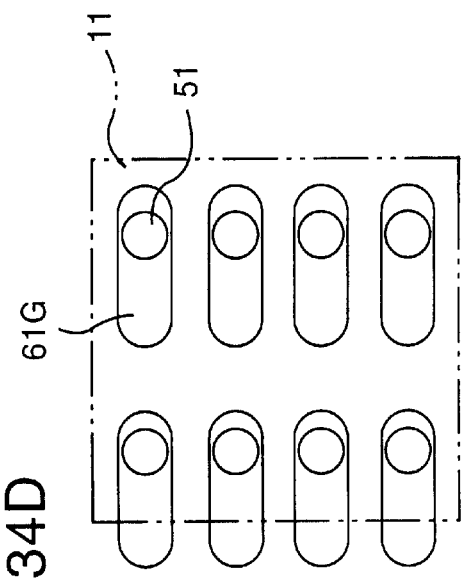
Figure 34B:
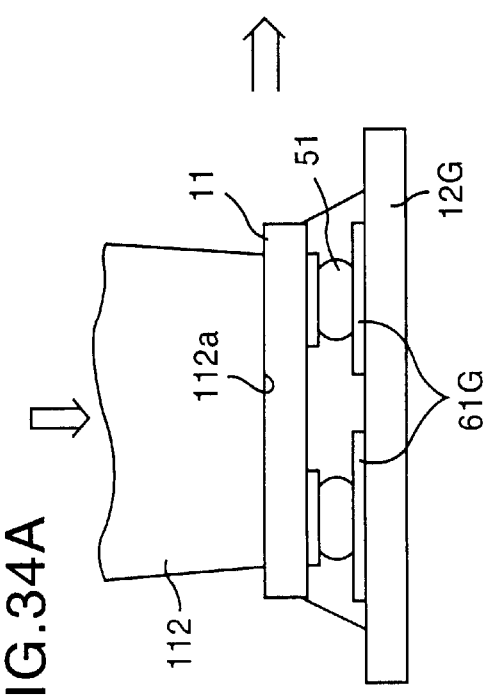
Figure 34D:
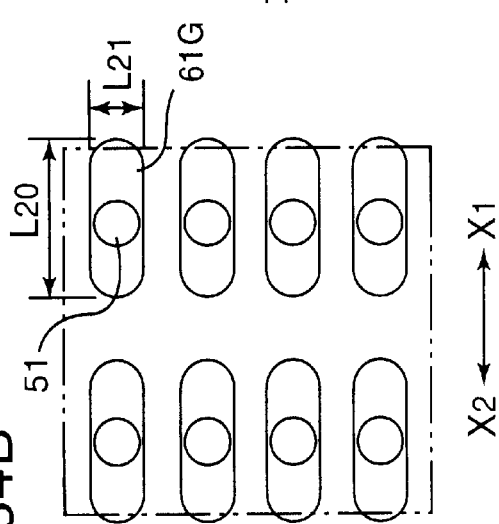

FIGS. 34A and 34B show the head IC chip 11 positioned onto the suspension 12G. Each of the Au bumps 51 is in contact with the center of each corresponding Au pad 61G. Since the end surface 112a of the bonding tool 112 has a little orientation, the head IC chip 11 is slightly deviated from the original position shown in FIGS. 34A and 34B in one direction of the ultrasonic oscillation (in the X1 direction, for instance) every time the bonding tool 112 ultrasonically oscillates. However, the Au pads 61G, which are elongated in the direction of the ultrasonic oscillation B applied by the bonding tool 112, prevent the respective Au bumps 51 from deviating from the respective Au pads 61. Thus, the Au bumps 51 are properly bonded to the Au pads 61G.

Instead of the bonding tool 112, any of the bonding tools 112C, 112D, and 112E shown in FIGS. 20 to 22 can be employed.

The long Au pads 61G are produced as shown in FIGS. 35A to 35H and 36A to 36D.

Figure 35A:
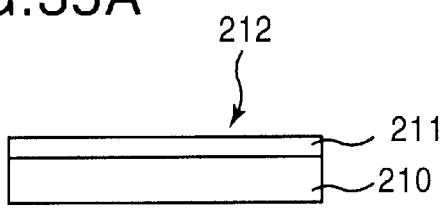
FIGS. 35A to 35H illustrate the production procedures of Au pads shown in FIGS. 34A to 34D.
Figure 35B:
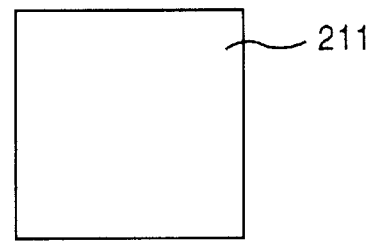
Figure 35C:
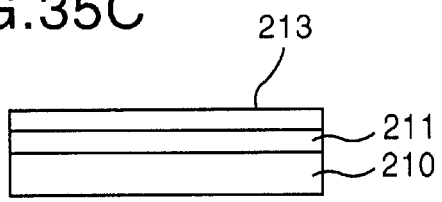
Figure 35D:
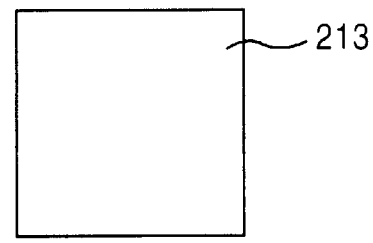
Figure 35E:
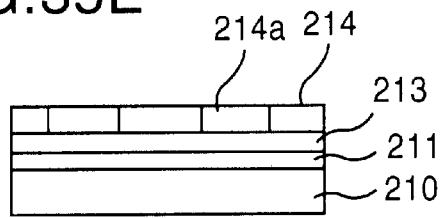
Figure 35F:
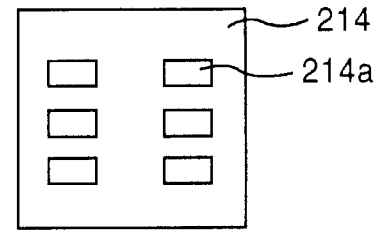
Figure 35G:
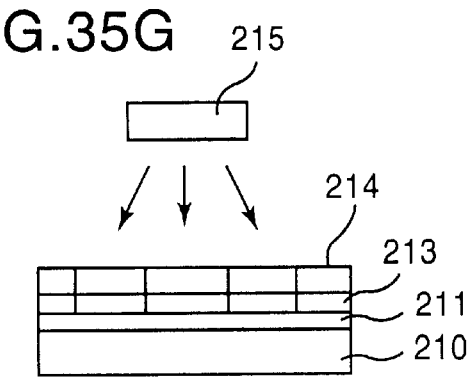
Figure 35H:
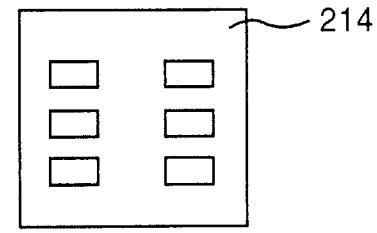
Figure 36A:
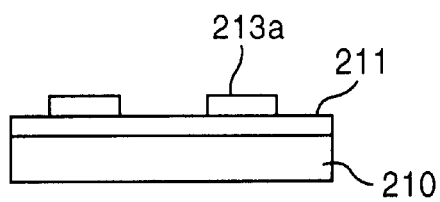
Figure 36B:
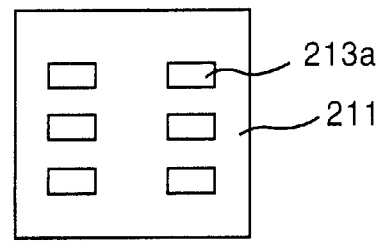
Figure 36C:
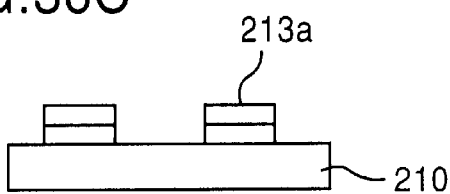
Figure 36D:
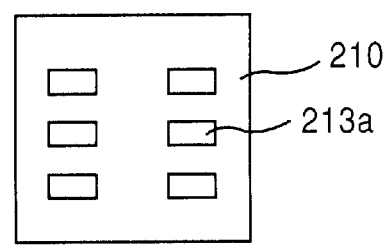
Figure 36E:
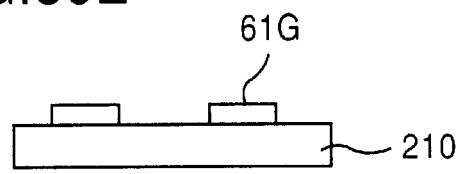
Figure 36F:
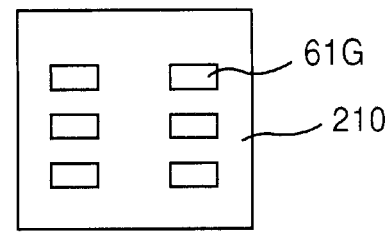

First, as shown in FIGS. 35A and 35B, copper foil 211 is bonded to the upper surface of a suspension base member 210 made of stainless steel, thereby forming a copper-foiled suspension 212. Next, a photoresist film 213 is formed on the copper-foiled suspension 212, as shown in FIGS. 35C and D. A photomask 214 provided with windows 214a having the same shape as the long Au pads 61G is positioned onto the photoresist film 213, as shown in FIGS. 35E and 35F. A light source 215 then exposes the suspension 212, as shown in FIGS. 35G and 35H, so as to harden the photoresist film 213. Next, photoresist-etching is performed to leave photoresist portions 213a, as shown in FIGS. 36A and 36B. The copper foil 211 is also etched as shown in FIGS. 36C and 36D, and the photoresist portions 213a are removed as shown in FIGS. 36E and 36F. Thus, the long Au pads 61G are formed on the suspension base member 210.

A sixth embodiment of the present invention solves the same problem solved by the fifth embodiment.

Figure 37A:
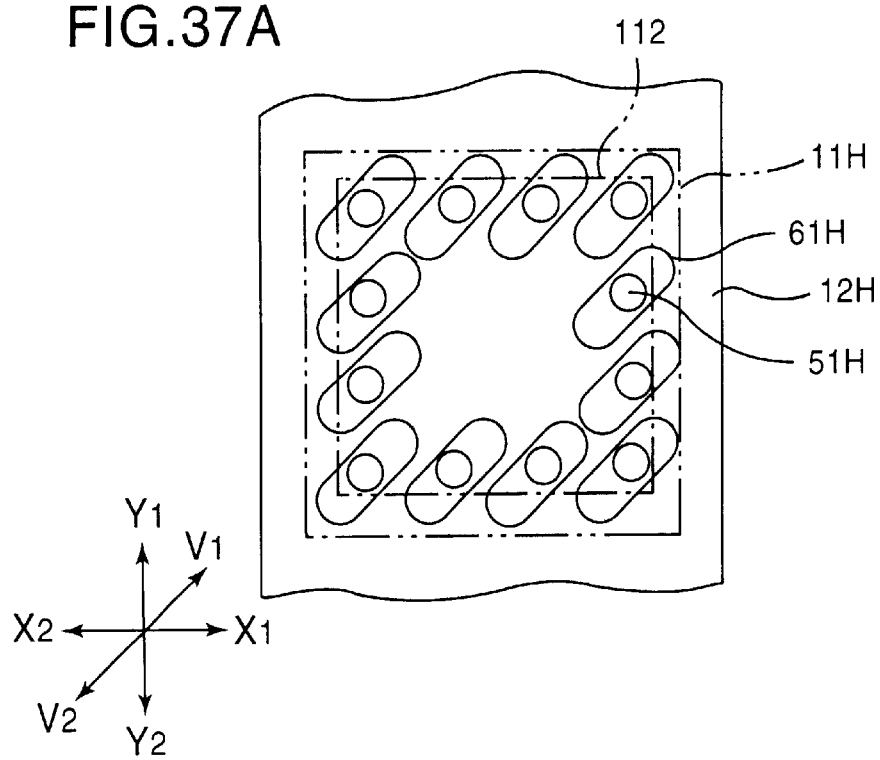
FIGS. 37A and 37B illustrate a head slider assembly of a sixth embodiment of the present invention.
Figure 37B:
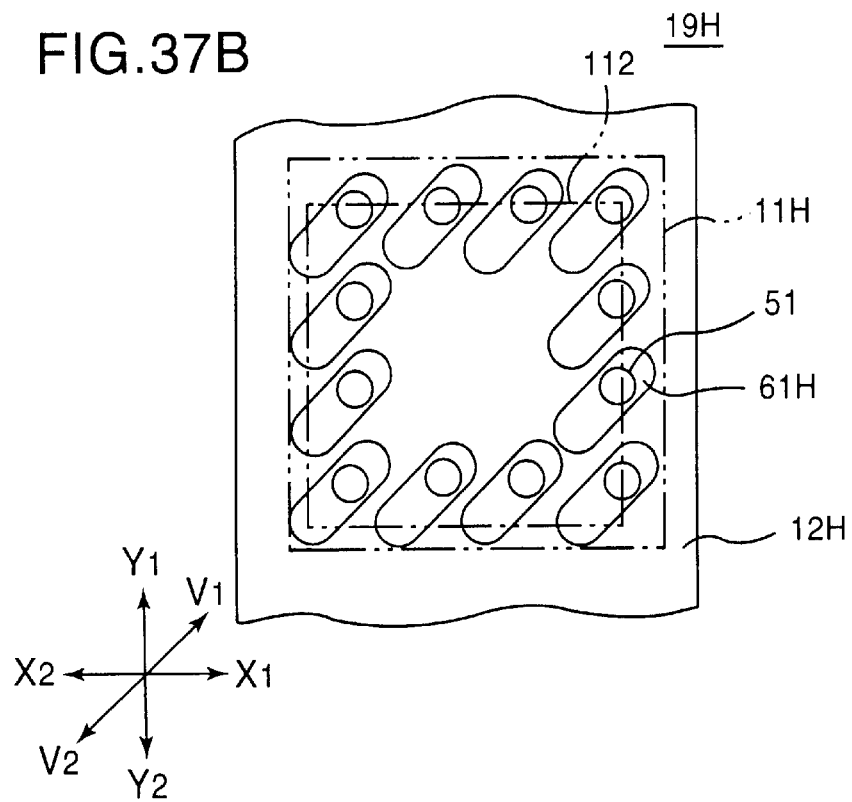

FIG. 37B illustrates a head slider assembly 19H of the sixth embodiment of the present invention. The head slider assembly 19H comprises a head IC chip 11H. This head IC chip 11H has Au bumps 51H arranged along the four sides. For ease of drawing, the outline of the head IC chip 11H and the outline of the bonding tool 112 are indicated by two-dot chain lines. As shown in FIG. 37A, the head slider assembly 19H positions the head IC chip 11H onto a suspension 12H. The bonding tool 112 then applies a load and ultrasonic oscillation to the head IC chip 11H, so that the Au bumps 51H are bonded to Au pads 61H on the suspension 12H, and that the head IC chip 11H is bonded to the suspension 12H by the hardened underfill (not shown).

In conformity with the structure of the Au bumps 51H attached to the head IC chip 11H, the Au pads 61H on the suspension 12H are arranged along the four side of the square. The Au pads 16H each have the same shape as the Au pads 61G shown in FIGS. 34A to 34D. The Au bumps 51H has a longitudinal direction V1–V2 between the X1 direction and the Y1 direction, which is equivalent to an axis line X1–X2 rotated counterclockwise at an angle of 45 degrees. In this arrangement, the Au bumps 51H can be prevented from interfering with each other. Also, the bonding tool 112 is designed to oscillate ultrasonically in the V1–V2 direction.

Due to the slight orientation of the end surface of the bonding tool 112, the head IC chip 11H is slightly deviated from the initial position shown in FIG. 37A in one oscillating direction (in the V1 direction, for instance) every time the bonding tool 112 ultrasonically oscillates. However, the Au bumps 51H do not separate from the Au pads 61H. and remains on the Au pads 61. Thus, the Au bumps 51H can be properly bonded to the Au pads 61H.

Instead of the bonding tool 112, any of the bonding tools 112C, 112D, and 112E, shown in FIGS. 20, 21, and 22, can be employed.

Figure 3A:
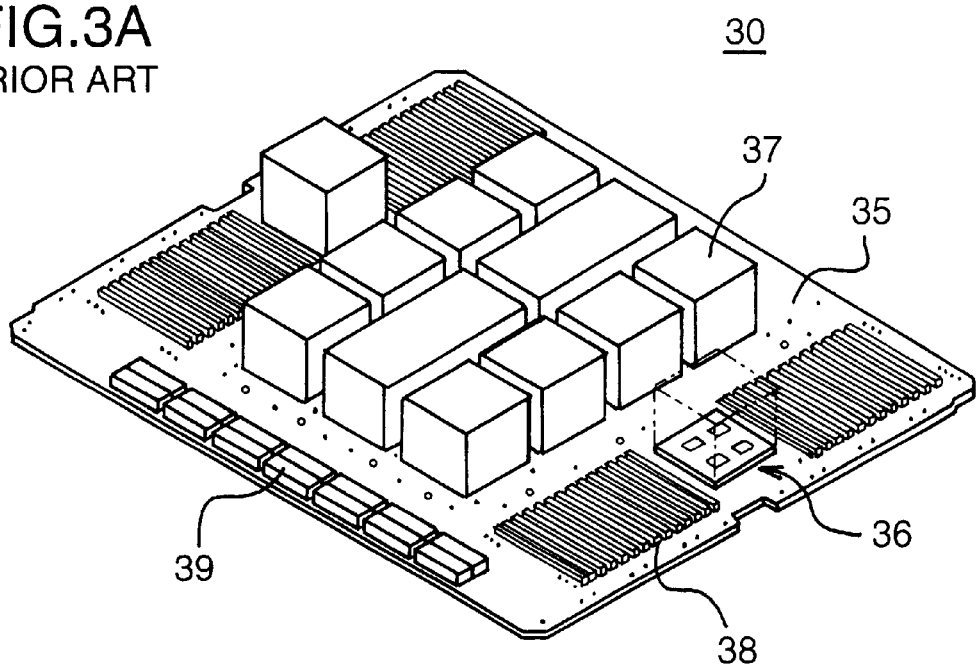
FIGS. 3A to 3C illustrate a conventional printed circuit board unit.
Figure 3B:
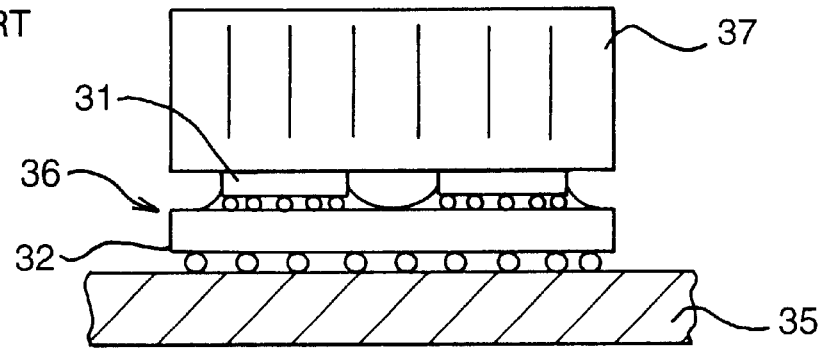
Figure 3C:
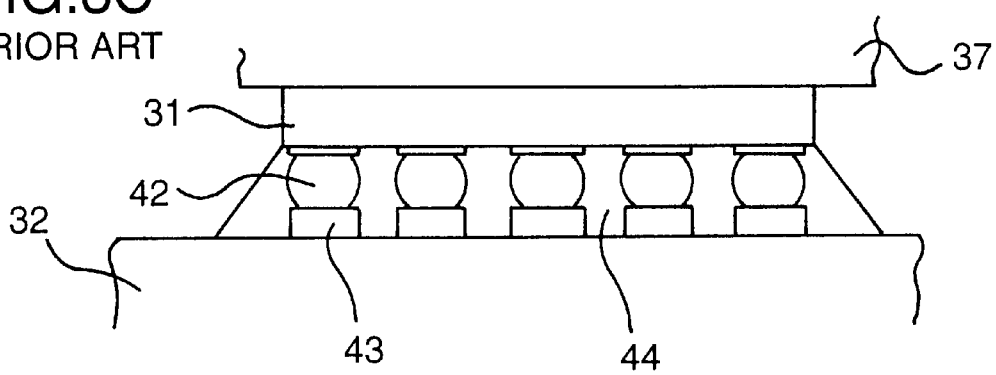

It should be noted that the present invention can be applied not only to the head slider assembly described above, but also to the mounting of the IC chip 31 on the substrate 32 in the multi chip module 36 of the printed circuit board unit 30 shown in FIG. 3.

What is claimed is:

1. A method of mounting a semiconductor chip to a substrate, comprising the steps of:

bonding bumps formed on the semiconductor chip to pads formed on the substrate by pressing the semiconductor chip, with insulating adhesive being interposed between the semiconductor chip and the substrate; and hardening the insulating adhesive spread out between the semiconductor chip and the substrate, wherein the bonding step includes the step of hardening a peripheral portion of the insulating adhesive spread out between the semiconductor chip and the substrate before a center portion of the insulative adhesive is hardened.

2. The method of mounting a semiconductor chip to a substrate as claimed in claim 1, wherein the bonding step further includes the step of applying ultrasonic oscillation to the semiconductor chip so that the bumps formed on the semiconductor chip are bonded to the pads formed on the substrate.

3. The method of mounting a semiconductor chip to a substrate as claimed in claim 1, wherein the peripheral portion of the insulating adhesive is hardened by one of light and heat.

4. A method of mounting a semiconductor chip to be mounted on a substrate by a bonding tool, comprising the steps of:

pressing the semiconductor chip while an insulating adhesive is interposed between the semiconductor chip provided with bumps and the substrate provided with pads, and ultrasonically bonding the bumps to the pads, wherein a sheet having a greater friction coefficient with the semiconductor chip and the bonding tool than a friction coefficient between the semiconductor chip and the bonding tool is interposed between the semiconductor chip and the bonding tool, thereby carrying out ultrasonic bonding.

* * * * *

UNITED STATES PATENT AND TRADEMARK OFFICE
CERTIFICATE OF CORRECTION

PATENT NO. : 6,437,450 B1
DATED : August 20, 2002
INVENTOR(S) : Baba et al.

It is certified that error appears in the above-identified patent and that said Letters Patent is hereby corrected as shown below:

<u>Title page,</u>
Insert Item -- [30] Foreign Application Priority Data
Apr. 25, 2000 [JP] ………. 2000-124878 --

Signed and Sealed this

Twenty-third Day of September, 2003

JAMES E. ROGAN
*Director of the United States Patent and Trademark Office*